(12) United States Patent
Sagawa et al.

(10) Patent No.: US 12,339,309 B2
(45) Date of Patent: Jun. 24, 2025

(54) ENERGIZATION INSPECTION APPARATUS, METHOD FOR MANUFACTURING SEMICONDUCTOR DEVICE, AND ENERGIZATION METHOD

(71) Applicant: Hitachi Power Semiconductor Device, Ltd., Hitachi (JP)

(72) Inventors: Masakazu Sagawa, Tokyo (JP); Kumiko Konishi, Tokyo (JP); Hiroshi Miki, Tokyo (JP); Yuki Mori, Tokyo (JP)

(73) Assignee: HITACHI POWER SEMICONDUCTOR DEVICE, LTD., Ibaraki (JP)

( * ) Notice: Subject to any disclaimer, the term of this patent is extended or adjusted under 35 U.S.C. 154(b) by 88 days.

(21) Appl. No.: 18/255,145

(22) PCT Filed: Feb. 24, 2022

(86) PCT No.: PCT/JP2022/007632
§ 371 (c)(1),
(2) Date: May 31, 2023

(87) PCT Pub. No.: WO2022/202076
PCT Pub. Date: Sep. 29, 2022

(65) Prior Publication Data
US 2023/0417819 A1  Dec. 28, 2023

(30) Foreign Application Priority Data
Mar. 24, 2021 (JP) .................... 2021-050041

(51) Int. Cl.
*G01R 31/26* (2020.01)
*G01R 31/54* (2020.01)
(Continued)

(52) U.S. Cl.
CPC ......... *G01R 31/2648* (2013.01); *G01R 31/54* (2020.01); *G01R 31/70* (2020.01); *H10D 62/8325* (2025.01)

(58) Field of Classification Search
CPC ............... G01R 31/01; G01R 31/2621; G01R 31/2648; G01R 31/54; G01R 31/70; H10D 12/031; H10D 30/66; H10D 62/8325
See application file for complete search history.

(56) References Cited

U.S. PATENT DOCUMENTS 6,859,023 B2 * 2/2005 Yamanaka ............... H01L 22/14
257/E21.531
11,262,399 B2 * 3/2022 Miyazato ........... G01R 31/2621
(Continued)

FOREIGN PATENT DOCUMENTS

JP   2017-212317 A   11/2017
JP   2018-205252 A   12/2018
(Continued)

OTHER PUBLICATIONS

Notice of Reasons for Refusal, issued Aug. 6, 2024, for Japanese Application No. 2023-508830 (with English translation).
(Continued)

*Primary Examiner* — Vinh P Nguyen
(74) *Attorney, Agent, or Firm* — Baker Botts L.L.P.

(57) ABSTRACT

An electric connection inspection device includes: a cooling plate; an insulating plate provided on the cooling plate; a first measurement electrode provided on the insulating plate; and a second measurement electrode and a third measurement electrode provided above the first measurement electrode and located apart from the first measurement electrode. The insulating plate includes a variable thermal resistance mechanism. A semiconductor device can be installed between the first measurement electrode and the second (Continued)

measurement electrode and between the first measurement electrode and the third measurement electrode.

5 Claims, 12 Drawing Sheets

(51) Int. Cl.
*G01R 31/70* (2020.01)
*H10D 62/832* (2025.01)

(56) References Cited

U.S. PATENT DOCUMENTS 12,255,258 B1 * 3/2025 Atanackovic ...... H10D 62/8325
2020/0292612 A1 9/2020 Miyazato

FOREIGN PATENT DOCUMENTS

| JP | 2019-216202 A | 12/2019 |
| JP | 2020-150181 A | 9/2020 |
| JP | 2020-187102 A | 11/2020 |

OTHER PUBLICATIONS

International Search Report, mailed May 24, 2022, for International Application No. PCT/JP2022/007632.

* cited by examiner

ENERGIZATION INSPECTION APPARATUS, METHOD FOR MANUFACTURING SEMICONDUCTOR DEVICE, AND ENERGIZATION METHOD

TECHNICAL FIELD

The present invention relates to an energization inspection apparatus, a method for manufacturing a semiconductor device, and an energization method, and particularly relates to an energization inspection apparatus for sorting a semiconductor device using a silicon carbide substrate, a method for manufacturing a semiconductor device using the energization inspection apparatus, and an energization method using the energization inspection apparatus.

BACKGROUND ART

As a field effect transistor (MISFET: Metal Insulator Semiconductor Field Effect Transistor) which is one of power semiconductor devices, conventionally, a power MISFET (Si power MISFET) using a silicon (Si) substrate has been mainstream. However, the electric field strength against dielectric breakdown in silicon carbide (SiC) is about one order of magnitude greater than the electric field strength in Si.

Therefore, in a power MISFET (SiC power MISFET) using a SiC substrate, the thickness of a drift layer for maintaining a withstand voltage can be reduced to about $\frac{1}{10}$, and the impurity concentration of the drift layer can be increased by about 100 times as compared with the Si power MISFET. As a result, in the SiC power MISFET, the element resistance can be theoretically reduced by three or more orders of magnitude. In addition, since SiC has a band gap about three times larger than that of Si, the SiC power MISFET can have low on-resistance at the same withstand voltage, and can operate in a high-temperature environment. Therefore, the SiC power MISFET is expected to have performance exceeding that of the Si power MISFET.

In the SiC power MISFET, a vertical planar structure in which a drain electrode is provided on the back surface side of the SiC substrate and a source electrode and a gate electrode are provided on the front surface side of the SiC substrate may be used. Such a vertical MISFET includes a parasitic pn diode constituted by a p-type body region and an n-type SiC epitaxial layer as a built-in diode between a source electrode and a drain electrode. The built-in diode can be used as a freewheeling diode used in an inverter.

However, the n-type SiC substrate may include a defect. In this case, when a current flows through the built-in diode, recombination of electrons and holes occurs inside the n-type SiC substrate or inside the n-type SiC epitaxial layer formed on the n-type SiC substrate. By recombination energy generated at this time, basal plane dislocations, which are a kind of crystal defects present in the SiC substrate, occur, and a stacking fault sandwiched between the two basal plane dislocations grows.

Since the stacking fault hardly causes a current to flow, when the stacking fault grows, the on-resistance of the SiC power MISFET and the forward voltage of the built-in diode increase. Since the stacking fault grows cumulatively, when such an operation is continued, a loss generated in the inverter circuit increases over time and the amount of generated heat also increases, which causes a failure of the semiconductor device (semiconductor chip).

Therefore, an inspection method for screening a semiconductor device having a SiC power MISFET and sorting a semiconductor device having no or almost no stacking fault is used.

For example, in PTL 1, first, a forward current is applied to a built-in diode to set a junction temperature of a SiC power MISFET. There is disclosed a method for sorting, thereafter, whether or not the semiconductor device is a nonconforming product by measuring an on-voltage Von0, applying a forward current to the built-in diode, measuring an on-voltage Von1 again, and calculating a value of change in voltage between the on-voltage Von0 and the on-voltage Von1.

CITATION LIST

Patent Literature

PTL 1: JP 2020-150181 A

SUMMARY OF INVENTION

Technical Problem

In an energization inspection apparatus that performs such a sorting method as described in PTL 1, a measurement electrode for applying a drain voltage and a cooling plate for cooling a semiconductor device are normally provided on a drain electrode side of a SiC power MISFET. In order to electrically insulate the measurement electrode and the cooling plate, an insulating plate is provided between the measurement electrode and the cooling plate.

In a normal energization inspection apparatus, a thermal resistance value of a structure including the insulating plate is fixed. Therefore, when the forward current is applied to the built-in diode and the maximum rated junction temperature is reached, the forward current cannot be further increased. Then, since it is necessary to lengthen the energization time in order to grow a stacking fault, there is a problem that a time required to screen the semiconductor device increases. Furthermore, when the specifications of the product, such as the maximum rating or the thickness of the semiconductor substrate, are changed, the growth rate of the defect also changes, and the screening condition also changes, so that the accuracy of the sorting of the semiconductor device cannot be kept constant.

A main object of the present application is to provide a method capable of reducing a time required to screen a semiconductor device and making the accuracy of the sorting of a semiconductor device constant regardless of specifications of a product. In addition, there is provided an energization inspection apparatus capable of achieving them. Another object of the present application is to provide a highly reliable semiconductor device 100 by precisely screening the semiconductor device 100.

Other problems and novel features will become apparent from the description of the present specification and the accompanying drawings.

Solution to Problem

An energization inspection apparatus according to an embodiment includes a cooling plate, an insulating plate provided on the cooling plate, a first electrode provided on the insulating plate, and a second electrode and a third electrode provided above the first electrode and located away from the first electrode. Here, the insulating plate has a variable thermal resistance mechanism, and a semiconductor device can be installed between the first electrode and the second electrode and between the first electrode and the third electrode.

A method for manufacturing a semiconductor device according to an embodiment uses an energization inspection apparatus including a cooling plate, an insulating plate provided on the cooling plate and having a variable thermal resistance mechanism, a first electrode provided on the insulating plate, and a second electrode and a third electrode provided above the first electrode and located away from the first electrode. Further, a method for manufacturing a semiconductor device includes: (a) preparing a semiconductor device including a drain electrode, a source electrode, and a gate pad electrode; (b) after step (a), installing the semiconductor device between the first electrode and the second electrode and between the first electrode and the third electrode, electrically connecting the first electrode to the drain electrode, electrically connecting the second electrode to the source electrode, and electrically connecting the third electrode to the gate pad electrode; (c) after step (b), adjusting a resistance value of the variable thermal resistance mechanism such that a maximum rated junction temperature of the semiconductor device is reached when a maximum rated forward current of the semiconductor device is applied to a built-in diode of the semiconductor device; (d) after step (c), measuring a first on-voltage of the semiconductor device; (e) after step (c), measuring a first leakage current when a specified voltage is applied between the source electrode and the drain electrode in a state where the source electrode and the gate pad electrode are electrically short-circuited or in a state where a negative bias is applied to the gate pad electrode with respect to the source electrode; (f) after steps (d) and (e), applying a forward current to the built-in diode; (g) after step (f), measuring a second on-voltage of the semiconductor device; (h) after step (g), calculating a value of change in voltage between the second on-voltage and the first on-voltage, and sorting the semiconductor device as a conforming product when the value of change in voltage is smaller than a specified rate; (i) after step (h), measuring a second leakage current when a specified voltage is applied between the source electrode and the drain electrode in a state where the source electrode and the gate pad electrode are electrically short-circuited or in a state where a negative bias is applied to the gate pad electrode with respect to the source electrode for the semiconductor device sorted as a conforming product; and (j) after step (i), calculating a value of change in current between the second leakage current and the first leakage current, and sorting the semiconductor device as a conforming product when the value of change in current is smaller than a specified value. Here, step (a) includes: (a1) preparing a semiconductor substrate of a first conductivity type that has a front surface and a back surface opposite to the front surface and is made of silicon carbide; (a2) forming a semiconductor layer of the first conductivity type made of silicon carbide on the front surface of the semiconductor substrate; (a3) forming a body region of a second conductivity type opposite to the first conductivity type in the semiconductor layer; (a4) forming a source region of the first conductivity type in the body region; (a5) forming a gate insulator film on the body region; (a6) forming a gate electrode on the gate insulator film; (a7) forming the source electrode on the body region and the source region such that the source electrode is electrically connected to the body region and the source region, and forming the gate pad electrode on the gate electrode such that the gate pad electrode is electrically connected to the gate electrode; and (a8) forming the drain electrode on the back surface of the semiconductor substrate. Further, the built-in diode includes the body region and the semiconductor layer.

An energization method according to an embodiment uses an energization inspection apparatus including a cooling plate, an insulating plate provided on the cooling plate and having a variable thermal resistance mechanism, a first electrode provided on the insulating plate, and a second electrode and a third electrode provided above the first electrode and located away from the first electrode. Further, the energization method includes: (a) preparing a semiconductor device including a drain electrode, a source electrode, and a gate pad electrode; (b) after step (a), installing the semiconductor device between the first electrode and the second electrode and between the first electrode and the third electrode, electrically connecting the first electrode to the drain electrode, electrically connecting the second electrode to the source electrode, and electrically connecting the third electrode to the gate pad electrode; (c) after step (b), adjusting a resistance value of the variable thermal resistance mechanism such that a maximum rated junction temperature of the semiconductor device is reached when a maximum rated forward current of the semiconductor device is applied to a built-in diode of the semiconductor device; (d) after step (c), measuring a first on-voltage of the semiconductor device; (e) after step (c), measuring a first leakage current when a specified voltage is applied between the source electrode and the drain electrode in a state where the source electrode and the gate pad electrode are electrically short-circuited or in a state where a negative bias is applied to the gate pad electrode with respect to the source electrode; (f) after steps (d) and (e), applying a forward current to the built-in diode; (g) after step (f), measuring a second on-voltage of the semiconductor device; (h) after step (g), calculating a value of change in voltage between the second on-voltage and the first on-voltage, and sorting the semiconductor device as a conforming product when the value of change in voltage is smaller than a specified rate; (i) after step (h), measuring a second leakage current when a specified voltage is applied between the source electrode and the drain electrode in a state where the source electrode and the gate pad electrode are electrically short-circuited or in a state where a negative bias is applied to the gate pad electrode with respect to the source electrode for the semiconductor device sorted as a conforming product; and (j) after step (i), calculating a value of change in current between the second leakage current and the first leakage current, and sorting the semiconductor device as a conforming product when the value of change in current is smaller than a specified value. Here, the semiconductor device includes: a semiconductor substrate of a first conductivity type that has a front surface and a back surface opposite to the front surface and is made of silicon carbide; a semiconductor layer of the first conductivity type formed on the front surface of the semiconductor substrate and made of silicon carbide; a body region of a second conductivity type opposite to the first conductivity type formed in the semiconductor layer; a source region of the first conductivity type formed in the body region; a gate insulator film formed on the body region; a gate electrode formed on the gate insulator film; the source electrode formed on the body region and the source region so as to be electrically connected to the body region and the source region; the gate pad electrode formed on the gate electrode so as to be electrically connected to the gate electrode; and the drain electrode formed on the back surface of the semiconductor substrate. Further, the built-in diode includes the body region and the semiconductor layer.

A method for manufacturing a semiconductor device according to an embodiment includes: (a) preparing a semiconductor device including a drain electrode, a source electrode, a gate pad electrode, and a built-in diode; (b) after step (a), measuring a first on-voltage of the semiconductor device; (c) after step (b), applying a forward current to the built-in diode; (d) after step (c), measuring a second on-voltage of the semiconductor device; (e) after step (d), calculating a value of change in voltage between the second on-voltage and the first on-voltage, and sorting the semiconductor device as a conforming product when the value of change in voltage is smaller than a first specified value; (f) after step (e), measuring a leakage current when a predetermined voltage is applied between the source electrode and the drain electrode in a state where the source electrode and the gate pad electrode are electrically short-circuited or in a state where a negative bias is applied to the gate pad electrode with respect to the source electrode for the semiconductor device sorted as a conforming product; and (g) after step (f), sorting the semiconductor device as a conforming product when the leakage current is smaller than a second specified value.

A method for manufacturing a semiconductor device according to an embodiment includes: (a) preparing a semiconductor device including a drain electrode, a source electrode, a gate pad electrode, and a built-in diode; (b) after step (a), measuring a first on-voltage of the semiconductor device; (c) after step (a), measuring a first leakage current when a specified voltage is applied between the source electrode and the drain electrode in a state where the source electrode and the gate pad electrode are electrically short-circuited or in a state where a negative bias is applied to the gate pad electrode with respect to the source electrode; (d) after steps (b) and (c), applying a forward current to the built-in diode; (e) after step (d), measuring a second on-voltage of the semiconductor device; (f) after step (e), calculating a value of change in voltage between the second on-voltage and the first on-voltage, and sorting the semiconductor device as a conforming product when the value of change in voltage is smaller than a first specified value; (g) after step (f), measuring a second leakage current when a predetermined voltage is applied between the source electrode and the drain electrode in a state where the source electrode and the gate pad electrode are electrically short-circuited or in a state where a negative bias is applied to the gate pad electrode with respect to the source electrode for the semiconductor device sorted as a conforming product; and (h) after step (g), calculating a value of change in current between the second leakage current and the first leakage current, and sorting the semiconductor device as a conforming product when the value of change in current is smaller than a third specified value.

Advantageous Effects of Invention

According to one embodiment, it is possible to reduce a time required to screen a semiconductor device and to make the accuracy of the sorting of the semiconductor device constant regardless of specifications of a product. In addition, it is possible to provide an energization inspection apparatus capable of achieving them. In addition, the semiconductor device 100 can be precisely screened, and the highly reliable semiconductor device 100 can be provided.

DESCRIPTION OF EMBODIMENTS

Figure 1:
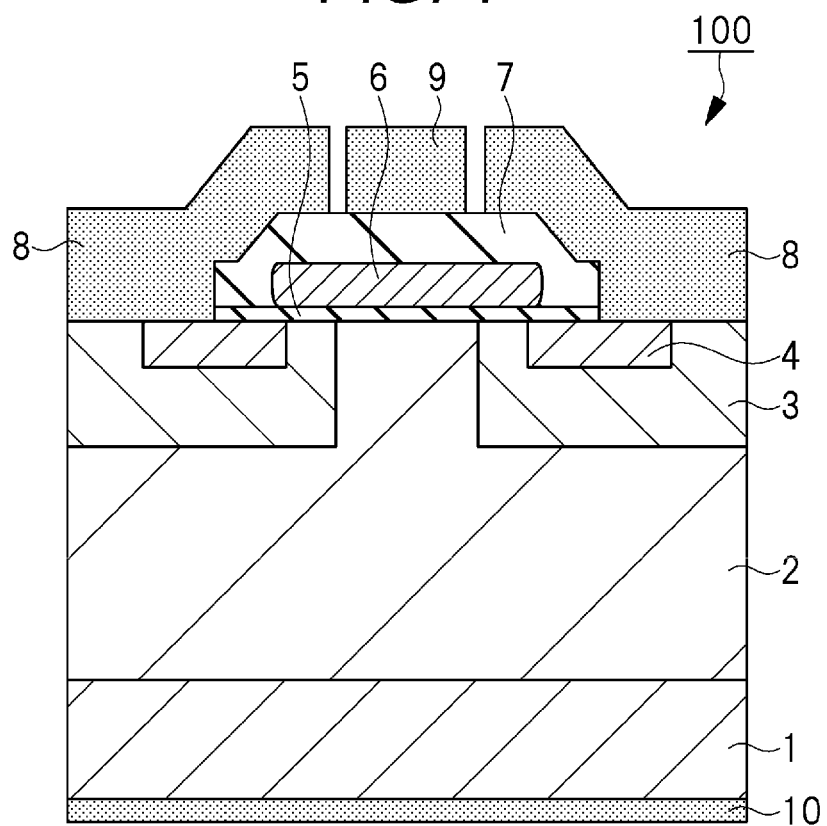
FIG. 1 is a cross-sectional view illustrating a semiconductor device according to a first embodiment.

Hereinafter, embodiments of the present invention will be described in detail with reference to the drawings. In all the drawings for describing the embodiments, members having the same functions are denoted by the same reference numerals, and repeated description thereof will be omitted. In addition, in the following embodiments, descriptions of the same or similar parts will not be repeated in principle unless particularly necessary.

First Embodiment

Hereinafter, a semiconductor device (semiconductor chip) 100, an energization inspection apparatus 200, and an energization method (method for manufacturing a semiconductor device) using the energization inspection apparatus 200 according to a first embodiment will be described in order.

Semiconductor Device

First, the semiconductor device 100 according to the first embodiment will be described with reference to FIG. 1. Here, a case where the semiconductor device 100 includes an n-type SiC power MISFET will be exemplified, but the SiC power MISFET may be a p-type SiC power MISFET. In that case, the conductivity types of impurities described below are all reversed. The SiC power MISFET has a vertical planar structure.

A semiconductor substrate 1 used in the first embodiment is a compound semiconductor substrate containing carbon and silicon, and is made of silicon carbide (SiC). The semiconductor substrate 1 has n-type conductivity and has a front surface and a back surface opposite to the front surface.

A drain electrode 10 is formed on the back surface of the semiconductor substrate 1. The drain electrode 10 is, for example, a laminated film of a titanium film, a nickel film, and a gold film, and the thickness of the drain electrode 10 is, for example, in a range of 0.5 to 1.0 μm. Note that the drain electrode 10 may be a single-layer film made of one of these films instead of the laminated film of these films, or may be a conductive film different from these films.

An n-type semiconductor layer (epitaxial layer) 2 made of silicon carbide and having an impurity concentration lower than that of the semiconductor substrate 1 is formed on the front surface of the semiconductor substrate 1. The semiconductor layer 2 functions as a drift layer and is electrically connected to the drain electrode 10. Therefore, a drain voltage is applied from the drain electrode 10 to the semiconductor layer 2 and the semiconductor substrate 1.

In the semiconductor layer 2, a p-type body region (impurity region) 3 is formed. In the body region 3, an n-type source region (impurity region) 4 is formed. The source region 4 has an impurity concentration higher than that of the semiconductor layer 2.

A gate electrode 6 is formed on the body region 3 and the semiconductor layer 2 via a gate insulator film 5. The gate insulator film 5 is an insulator film made of, for example, silicon oxide, and the gate electrode 6 is a conductive film such as polycrystalline silicon into which n-type impurities are introduced, for example. A gate voltage is applied to the gate electrode 6 from a gate pad electrode 9 described later.

The gate electrode 6 is covered with an interlayer insulator film 7. The interlayer insulator film 7 is an insulator film made of, for example, silicon oxide. An opening that opens a part of the source region 4 and a part of the body region 3 is formed in the interlayer insulator film 7.

A source electrode (source pad electrode) 8 is formed on the interlayer insulator film 7 so as to fill the inside of the opening of the interlayer insulator film 7 and to be electrically connected to the body region 3 and the source region 4. The source electrode 8 includes a barrier metal film and a conductive film formed on the barrier metal film. The barrier metal film is, for example, a laminated film including a titanium film and a titanium nitride film, and the conductive film is, for example, an aluminum film.

Although not illustrated here, an opening that partially opens the gate electrode 6 is formed in the interlayer insulator film 7. A gate pad electrode 9 electrically connected to the gate electrode 6 is formed on the interlayer insulator film 7 so as to fill the inside of the opening. The gate pad electrode 9 is made of the same material as that of the source electrode 8.

Parameters such as the depth and impurity concentration of each component in the first embodiment will be described below. Each depth described below is a depth from the surface of the semiconductor layer 2. In other words, each of these depths is the thickness of each impurity region.

The n-type semiconductor substrate 1 has an impurity concentration of, for example, $1 \times 10^{18}$ to $1 \times 10^{21}$ cm$^{-3}$.

The n-type semiconductor layer 2 has a thickness of, for example, 5 to 50 μm, and has an impurity concentration of, for example, $1 \times 10^{14}$ to $1 \times 10^{17}$ cm$^{-3}$.

The p-type body region 3 has a thickness of, for example, 500 to 2000 nm, and has an impurity concentration of, for example, $1 \times 10^{16}$ to $1 \times 10^{19}$ cm$^{-3}$.

The n-type source region 4 has a thickness of, for example, 100 to 1000 nm, and has an impurity concentration of, for example, $1 \times 10^{19}$ to $1 \times 10^{21}$ cm$^{-3}$.

The gate electrode 6 functions as a gate of the SiC power MISFET, the source region 4 functions as a source of the SiC power MISFET, the semiconductor layer 2 functions as a drain of the SiC power MISFET, and the body region 3 located below the gate electrode 6 functions as a channel region of the SiC power MISFET. In addition, a parasitic pn diode constituted by the p-type body region 3 and the n-type semiconductor layer 2 can be used as a built-in diode, and this built-in diode can be used as a freewheeling diode used for an inverter.

Method for Manufacturing Semiconductor Device (SiC Power MISFET)

A method for manufacturing the semiconductor device 100 will be described below with reference to FIGS. 2 to 4.

Figure 2:
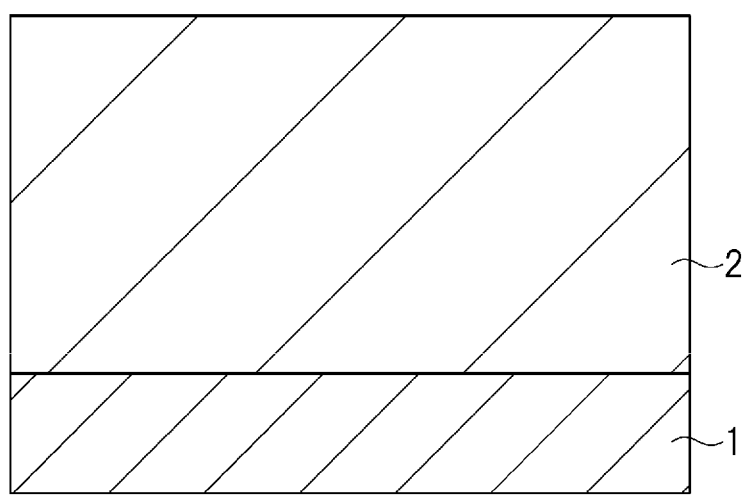
FIG. 2 is a cross-sectional view illustrating a method for manufacturing the semiconductor device illustrated in FIG. 1.

First, as illustrated in FIG. 2, the semiconductor substrate 1 is prepared. Next, the semiconductor layer 2 is formed on the front surface of the semiconductor substrate 1 by, for example, an epitaxial growth method.

Figure 3:
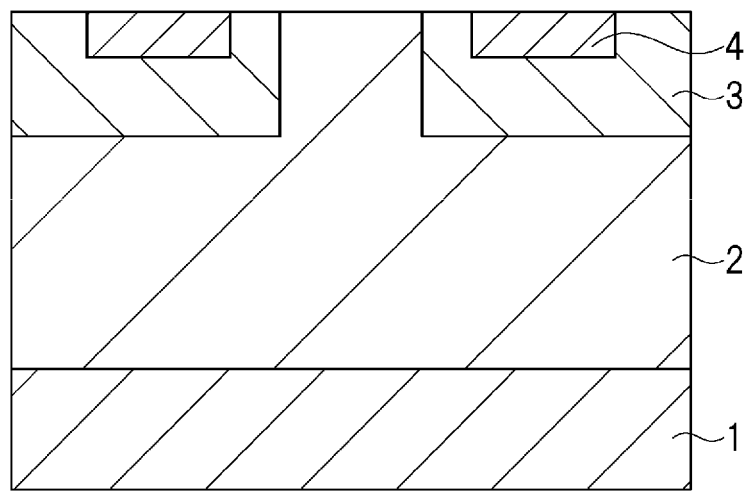
FIG. 3 is a cross-sectional view illustrating the method for manufacturing the semiconductor device, which is subsequent to FIG. 2.

Next, as illustrated in FIG. 3, the body region 3 is formed in the semiconductor layer 2 by a photolithography technique and ion implantation. Next, the source region 4 is formed in the body region 3 by a photolithography technique and ion implantation.

Figure 4:
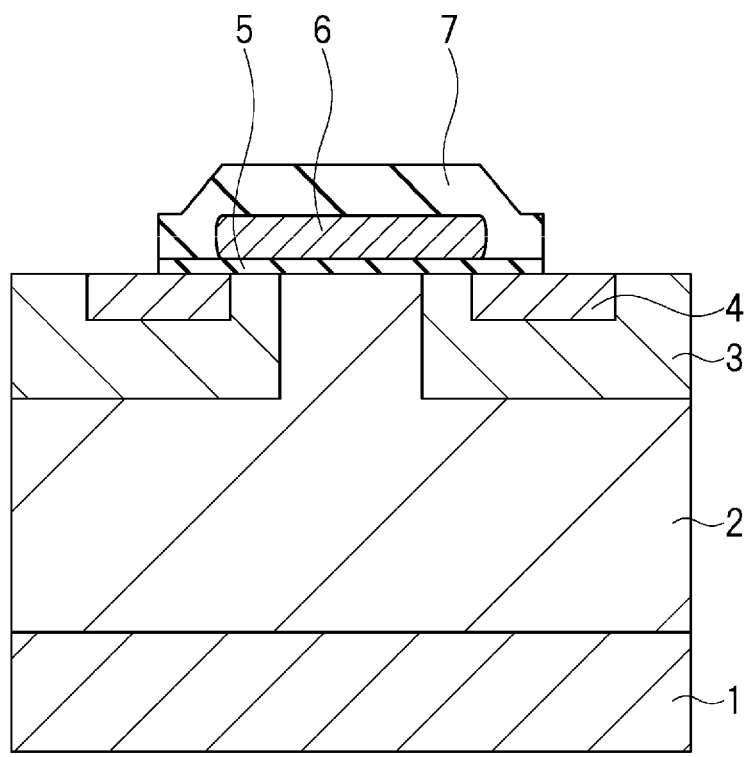
FIG. 4 is a cross-sectional view illustrating the method for manufacturing the semiconductor device, which is subsequent to FIG. 3.

Next, as illustrated in FIG. 4, the gate insulator film 5 is formed on the semiconductor layer 2 including the body region 3 and the source region 4 by, for example, a chemical vapor deposition (CVD) method. Next, the gate electrode 6 is formed on the gate insulator film 5 by, for example, a CVD method. Next, the gate electrode 6 is patterned by a photolithography technique and an etching process.

Next, the interlayer insulator film 7 is formed on the semiconductor layer 2 by, for example, a CVD method so as to cover the gate electrode 6. Next, a part of the interlayer insulator film 7 is patterned by a photolithography technique and an etching process to form a plurality of openings penetrating the interlayer insulator film 7 and the gate insulator film 5. The plurality of openings includes an opening that reaches a part of the body region 3 and a part of the source region 4, and an opening that reaches a part of the gate electrode 6.

After the step illustrated in FIG. 4, the semiconductor device 100 illustrated in FIG. 1 is manufactured through the following steps. First, the barrier metal film and the conductive film are sequentially formed on the interlayer insulator film 7 by, for example, a sputtering method or a CVD method so as to fill the insides of the plurality of openings of the interlayer insulator film 7. Next, the barrier metal film and the conductive film are patterned by a photolithography technique and an etching process to form the source electrode 8 and the gate pad electrode 9. The source electrode 8 is electrically connected to the body region 3 and the source region 4, and the gate pad electrode 9 is electrically connected to the gate electrode 6. Next, the drain electrode 10 is formed on the back surface of the semiconductor substrate 1 by, for example, a sputtering method or a CVD method. The drain electrode 10 is electrically connected to the semiconductor substrate 1 and the semiconductor layer 2.

Note that, although detailed description is omitted here, a plurality of semiconductor devices 100 is manufactured on the semiconductor substrate 1 in a wafer state. The semiconductor substrate 1 in a wafer state is divided by dicing to obtain the semiconductor device 100 as one semiconductor chip.

Energization Inspection Apparatus

The energization inspection apparatus 200 according to the first embodiment will be described with reference to FIG. 5.

Figure 5:
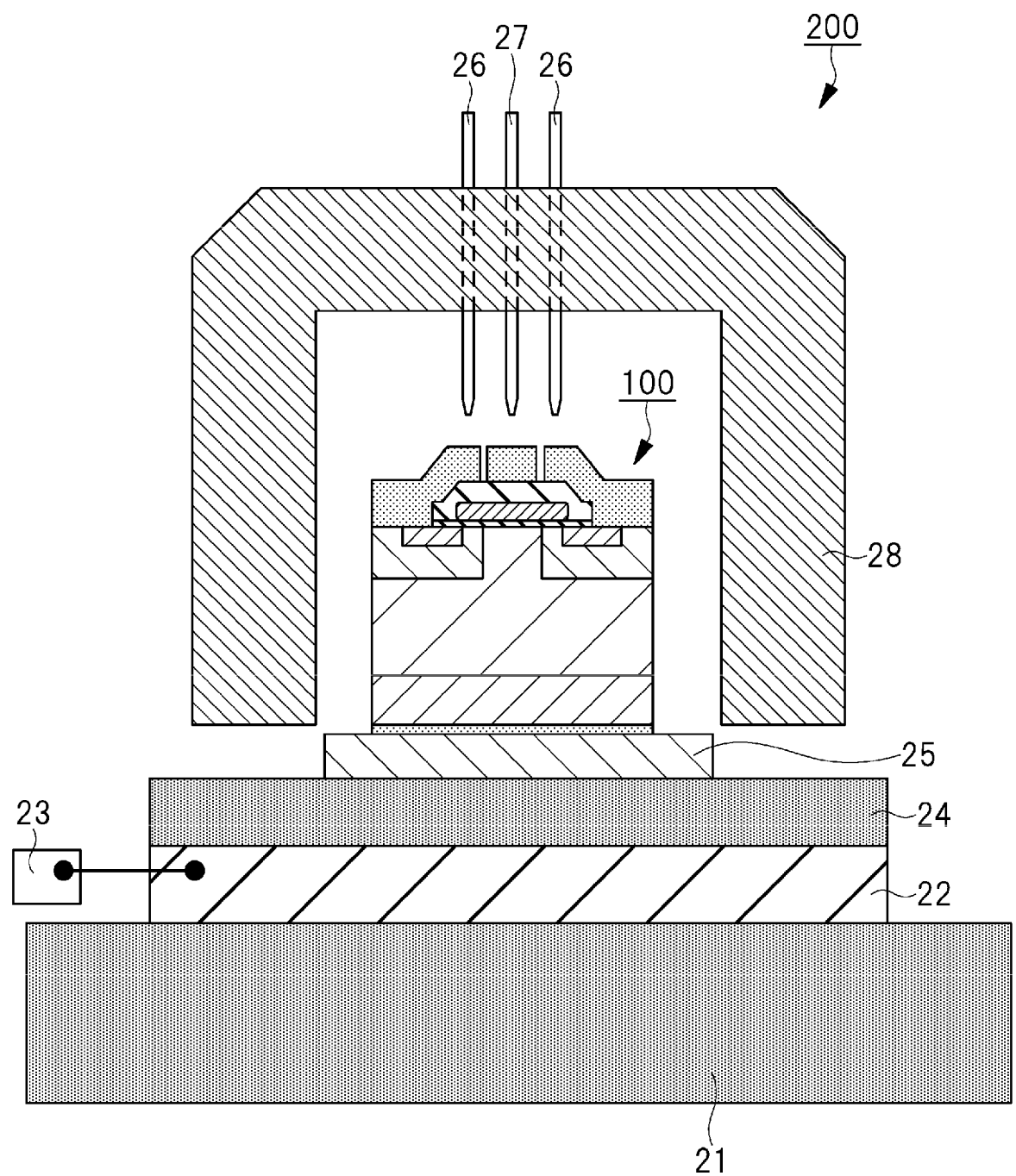
FIG. 5 is a cross-sectional view illustrating an energization inspection apparatus according to the first embodiment.
Figure 6:
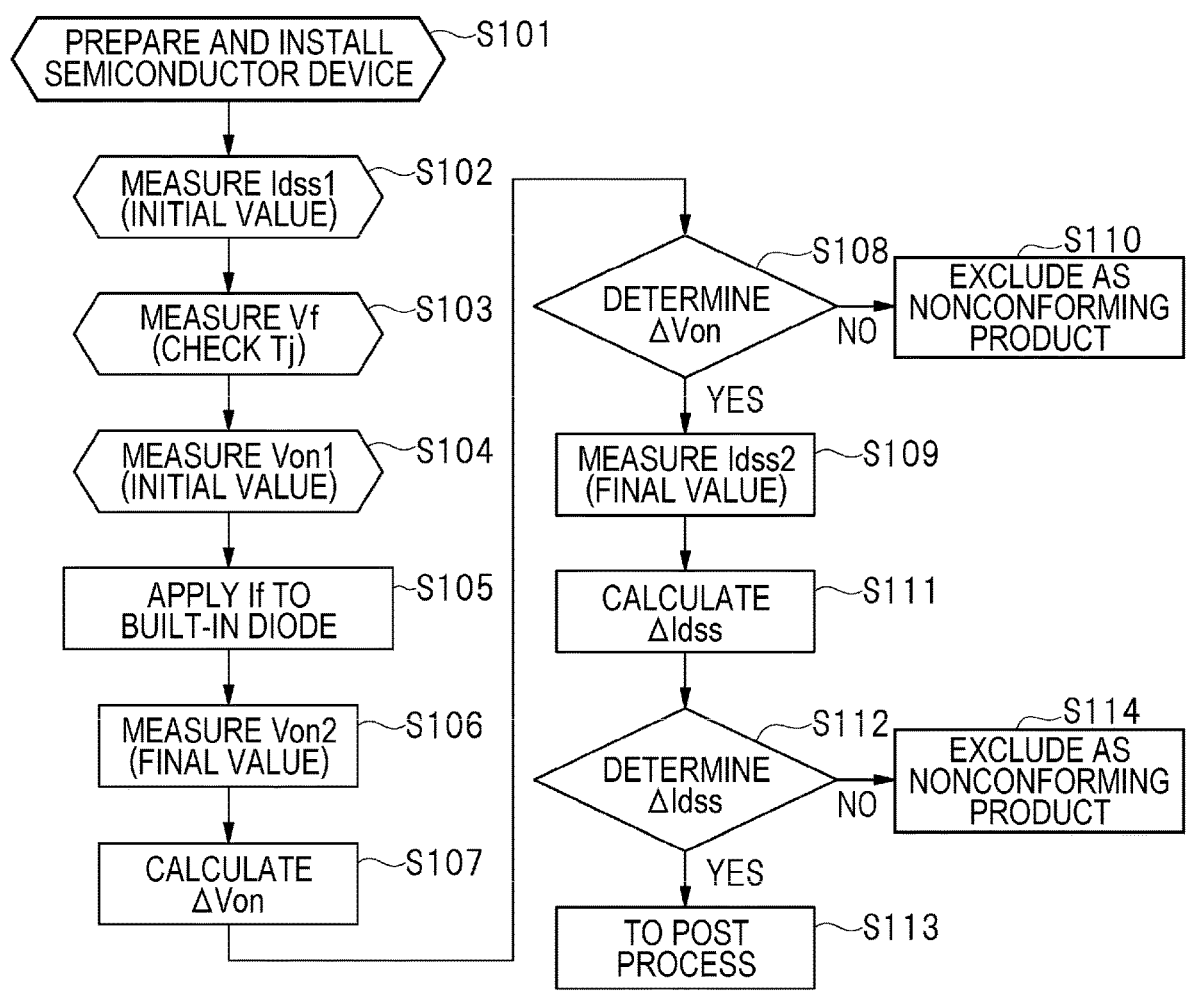
FIG. 6 is a flowchart illustrating an energization method in a study example.

As illustrated in FIG. 5, the energization inspection apparatus 200 includes a cooling plate 21, an insulating plate 22, a control device 23, a measurement electrode 24, a conductive sheet 25, a measurement electrode 26, a measurement electrode 27, and a pressure vessel 28.

The cooling plate 21 is made of, for example, a copper plate whose surface is plated with nickel. The cooling plate 21 has a cooling mechanism for cooling heat generated from the semiconductor device 100 when the semiconductor device 100 is energized using the energization inspection apparatus 200.

The insulating plate 22 is provided on the cooling plate 21 and is made of, for example, ceramic or aluminum oxide. The insulating plate 22 includes a variable thermal resistance mechanism connected to the control device 23. The variable thermal resistance mechanism is, for example, a heat pump, a micro heat pump, or a heat pipe.

For example, the thermal resistance value of the insulating plate 22 can be changed by performing adjustment means such as adjusting a current flowing to the variable thermal resistance mechanism or adjusting the flow rate of gas flowing to the variable thermal resistance mechanism by the control device 23.

The measurement electrode 24 is provided on the insulating plate 22, and is made of, for example, a copper plate whose surface is plated with gold. The conductive sheet 25 is provided on the measurement electrode 24 and is made of, for example, graphite. A main function of the conductive sheet 25 is to promote thermal contact between the drain electrode 10 and the measurement electrode 24 and to make the temperature of the entire semiconductor device 100 uniform by high thermal conductivity in the surface of the conductive sheet 25. When the semiconductor device 100 is energized, the measurement electrode 24 is electrically connected to the drain electrode 10 via the conductive sheet 25, and a drain voltage is applied from the measurement electrode 24 to the drain electrode 10.

The measurement electrode 26 and the measurement electrode 27 are attached to the pressure vessel 28, provided above the measurement electrode 24, and located away from the measurement electrode 24. The semiconductor device 100 can be installed between the measurement electrode 24 and the measurement electrode 26 and between the measurement electrode 24 and the measurement electrode 27. When the semiconductor device 100 is energized, the measurement electrode 26 is electrically connected to the source electrode 8, a source voltage is applied from the measurement electrode 26 to the source electrode 8, the measurement electrode 27 is electrically connected to the gate pad electrode 9, and a gate voltage is applied from the measurement electrode 27 to the gate pad electrode 9.

The measurement electrode 26 and the measurement electrode 27 have a needle shape, are made of, for example, an alloy mainly containing palladium, and contain silver, gold, platinum, copper, and the like in addition to palladium. Although two measurement electrodes 26 and one measurement electrode 27 are illustrated in FIG. 5, the energization inspection apparatus 200 may include a plurality of measurement electrodes 26 and a plurality of measurement electrodes 27.

The pressure vessel 28 is provided on the measurement electrode 24, and can change a pressure inside the pressure vessel 28 to a pressure different from a pressure outside the pressure vessel 28. When the semiconductor device 100 is installed between the measurement electrode 24 and the measurement electrode 26 and between the measurement electrode 24 and the measurement electrode 27, the semiconductor device 100 is housed inside the pressure vessel 28.

For example, in a case where the semiconductor device 100 is energized, the pressure inside the pressure vessel 28 can be set to a pressure higher than the pressure (atmospheric pressure) outside the pressure vessel 28. In addition, in order to prevent discharge when the semiconductor device 100 is energized, the pressure vessel 28 is preferably made of an insulator such as glass or resin.

Energization Method in Study Example

An energization method of a study example studied by the inventors of the present application will be described below with reference to S110.

In the study example, whether the semiconductor device 100 is a conforming product is sorted by calculating a value of change in voltage between the on-voltages before and after the forward current is applied to the built-in diode, similarly to PTL 1. For example, the semiconductor device 100 in which the value of change in the on-voltage increases due to the growth of a stacking fault is excluded as a nonconforming product.

Here, it has been clarified by the study of the inventors of the present application that the growth of the stacking fault causes a phenomenon that the blocking withstand voltage of the SiC power MISFET decreases. Furthermore, it has been clarified by the study of the inventors of the present application that this phenomenon occurs regardless of the value of change in the on-voltage.

Therefore, in the energization method of the study example, not only the determination based on the value of change in the on-voltage but also the determination based on the fluctuation of the blocking withstand voltage are performed. The fluctuation of the blocking withstand voltage described herein is determined based on a fluctuation value of a leakage current Idss when a specified voltage is applied between the source electrode 8 and the drain electrode 10 in a state where the source electrode 8 and the gate pad electrode 9 are electrically short-circuited or in a state where a negative bias is applied to the gate pad electrode with respect to the source electrode. Again, the energization method of the study example is not a conventionally known technique but a new energization method devised by the inventors of the present application.

Unlike the energization inspection apparatus 200 according to the first embodiment, an energization inspection apparatus used in the study example does not include the variable thermal resistance mechanism in the insulating plate 22, and the pressure vessel 28 is not used.

First, in step S101, the semiconductor device 100 is prepared. That is, the semiconductor device 100 manufactured by the manufacturing process described with reference to FIGS. 1 to 4 is prepared. Next, the semiconductor device 100 is transferred to the energization inspection apparatus 200, and the semiconductor device 100 is installed between the measurement electrode 24 and the measurement electrode 26 and between the measurement electrode 24 and the measurement electrode 27. Then, the measurement electrode 24 is electrically connected to the drain electrode 10, the measurement electrode 26 is electrically connected to the source electrode 8, and the measurement electrode 27 is electrically connected to the gate pad electrode 9.

In step S102, in a state where the source electrode 8 and the gate pad electrode 9 are electrically short-circuited or in a state where a negative bias is applied to the gate pad electrode 9 with respect to the source electrode 8, 0 V is applied to the source electrode 8, and a leakage current Idss1 when a specified high voltage is applied to the drain electrode 10 is measured.

In step S103, the junction temperature Tj of the semiconductor device 100 is set. The junction temperature Tj is set by applying a forward current If to the built-in diode. The forward current If is a current flowing from the source electrode 8 to the drain electrode 10 when a positive voltage is applied to the source electrode 8 and 0 V is applied to the drain electrode 10 in a state where the source electrode 8 and the gate pad electrode 9 are short-circuited or in a state where a negative bias is applied to the gate pad electrode 9 with respect to the source electrode 8. Here, the forward current If is caused to flow until the junction temperature Tj reaches 175° C., and a forward voltage Vf at that time is measured. The forward current If may be applied as a direct current or a pulse having an appropriate duty ratio of, for example, 50%.

In step S104, the on-voltage Von1 in the initial state is measured. The on-voltage is a potential difference between the drain electrode 10 and the source electrode 8 when the SiC power MISFET is in an ON state. That is, the on-voltage is a potential difference between the drain electrode 10 and the source electrode 8 in a state where a current flows from the drain electrode 10 to the source electrode 8 by applying a positive voltage to the drain electrode 10, applying 0 V to the source electrode 8, and gradually increasing the voltage of the gate electrode 6.

In step S105, the forward current If is applied to the built-in diode of the semiconductor device 100 to grow a stacking fault. Note that a condition for applying the forward current If is the same as that in step S103.

In step S106, an on-voltage Von2 in the final state is measured by the same method as in step S104.

In step S107, a value ΔVon of change in voltage between the on-voltage Von2 and the on-voltage Von1 is calculated. The value ΔVon of change is obtained from ΔVon=(Von2−Von1)/Von1. The value ΔVon of change described here is an absolute value.

In step S108, the value ΔVon of change is determined. The change in the on-voltage means that the stacking fault grows and the on-resistance increases. When the value ΔVon of change is smaller than a specified value, the semiconductor device 100 is sorted as a conforming product. For example, when the value ΔVon of change is smaller than 0.02 (YES), the semiconductor device 100 is sorted as a conforming product. Then, the next step is step S109. When the value ΔVon of change is larger than or equal to 0.02 (NO), the semiconductor device 100 is excluded as a nonconforming product as in step S110.

In step S109, a leakage current Idss2 in the final state is measured by the same method as in step S102.

In step S111, the value ΔIdss of change in current between the leakage current Idss2 and the leakage current Idss1 is calculated. The value ΔIdss of change is obtained from ΔIdss=Idss2−Idss1. The value ΔIdss of change described here is an absolute value.

In step S112, the value ΔIdss of change is determined. When the value ΔIdss of change is smaller than a specified value, the semiconductor device 100 is sorted as a conforming product. For example, when the value ΔIdss of change is less than 1 μA (YES), the semiconductor device 100 is sorted as a conforming product. Then, the next step is step S113, and a post process or the like is performed on the semiconductor device 100. When the value ΔIdss of change is greater than or equal to 1 μA (NO), the semiconductor device 100 is excluded as a nonconforming product as in step S114.

Problems of Study Example

Problems of the study example will be described below with reference to FIGS. 7 to 10.

In the study example, when the forward current If is applied to the built-in diode, the maximum rated junction temperature Tjmax becomes a rate-limiting factor, and there is a problem that it is difficult to set the forward current If to the maximum rated forward current Ifmax. If the forward current If cannot be set to the maximum rated forward current Ifmax, the energization time needs to be lengthened in order to grow the stacking fault, and thus there is a problem that a time required to screen the semiconductor device increases. In order to set to the maximum rated forward current Ifmax, there is also a method of pulse-driving at an appropriate duty ratio to obtain the maximum rated junction temperature Tjmax, but in this case as well, the inverse number of the duty ratio is not effective means because the energization time becomes long.

Figure 7:
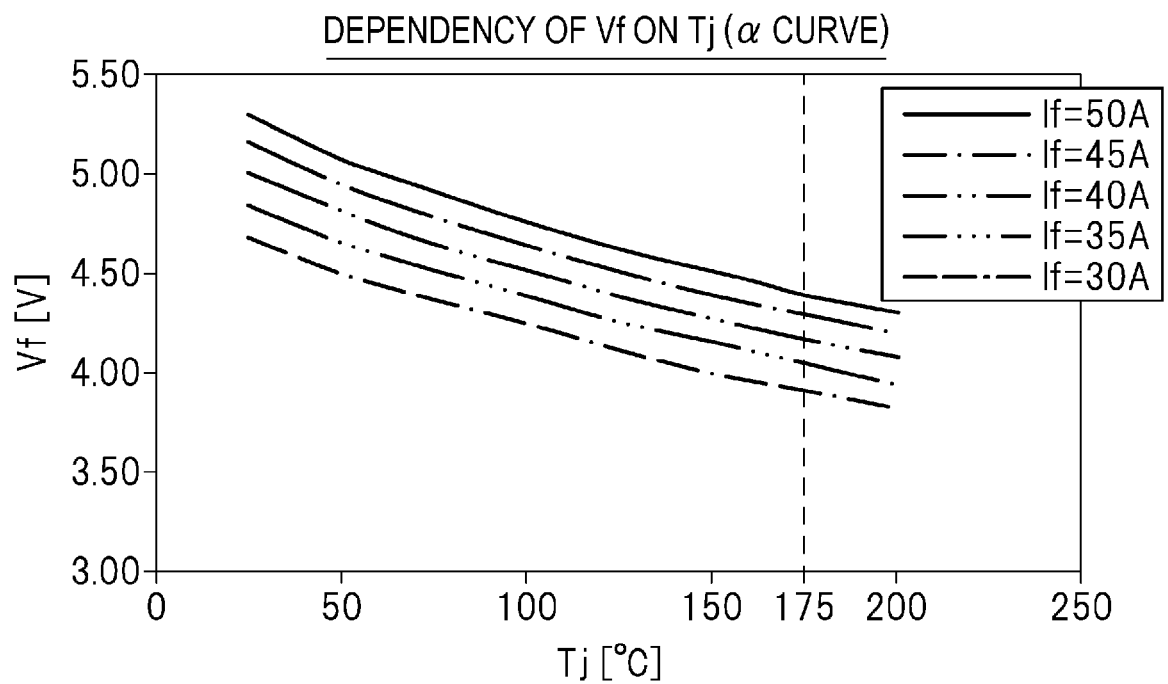
FIG. 7 is a graph illustrating the dependence (α curve) of a forward voltage on a junction temperature.

FIG. 7 illustrates the dependency (α curve) of the forward voltage Vf on the junction temperature Tj of the semiconductor device 100 in a case where the forward current If is in the range of 30 A to 50 A. The junction temperature Tj of the semiconductor device 100 in the equilibrium state by thermal contact with the cooling plate 21 and the like is expressed by the following "Equation 1" using a thermal resistance value Rth. Tcp is normal temperature (25° C.)

$$Tj = Tcp + Rth \times Vf \times If \qquad \text{(Equation 1)}$$

Figure 8:
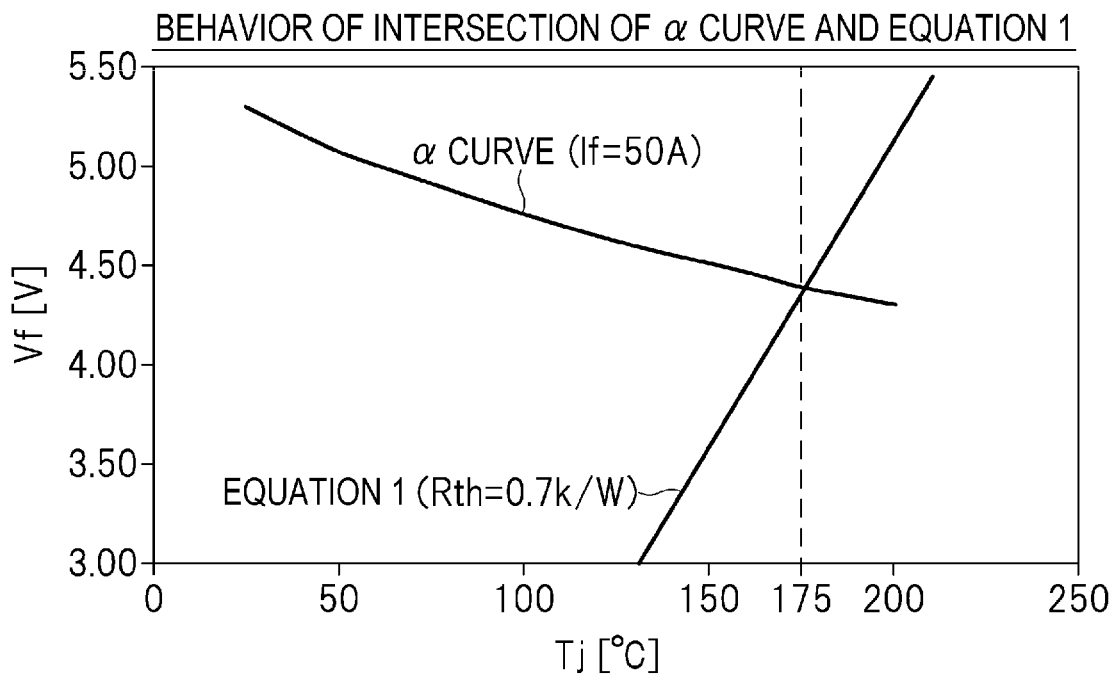
FIG. 8 is a graph illustrating a behavior of an intersection of an α curve and Equation 1.

Here, as illustrated in FIG. 8, "Equation 1" can be derived by a straight line of a linear function. For example, in a case where the maximum rated junction temperature Tjmax is 175° C., when the thermal resistance value Rth is set to 0.7 k/W, the intersection of the α curve at the maximum rated forward current Ifmax (50 A) and Equation 1 can be calculated as the optimum condition.

Figure 9:
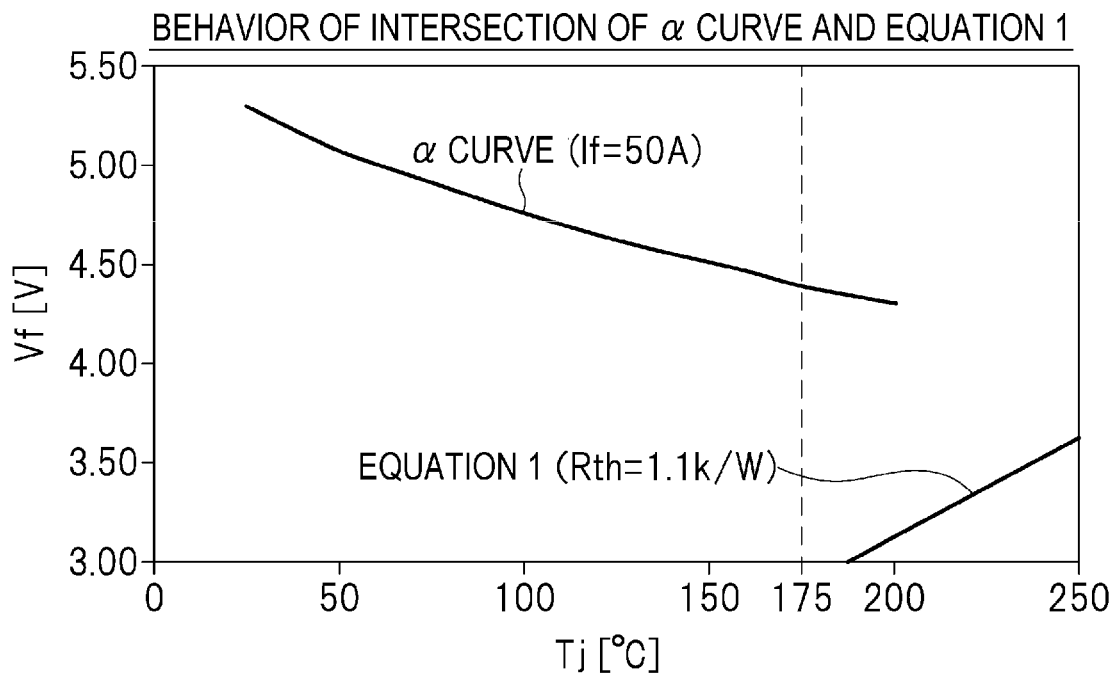
FIG. 9 is a graph illustrating a behavior of the intersection of the α curve and Equation 1.

On the other hand, as illustrated in FIG. 9, when the thermal resistance value Rth is 1.1 k/W, the junction temperature Tj at the intersection of the α curve and Equation 1 becomes too high, and exceeds 175° C. that is the maximum rated junction temperature Tjmax.

Figure 10:
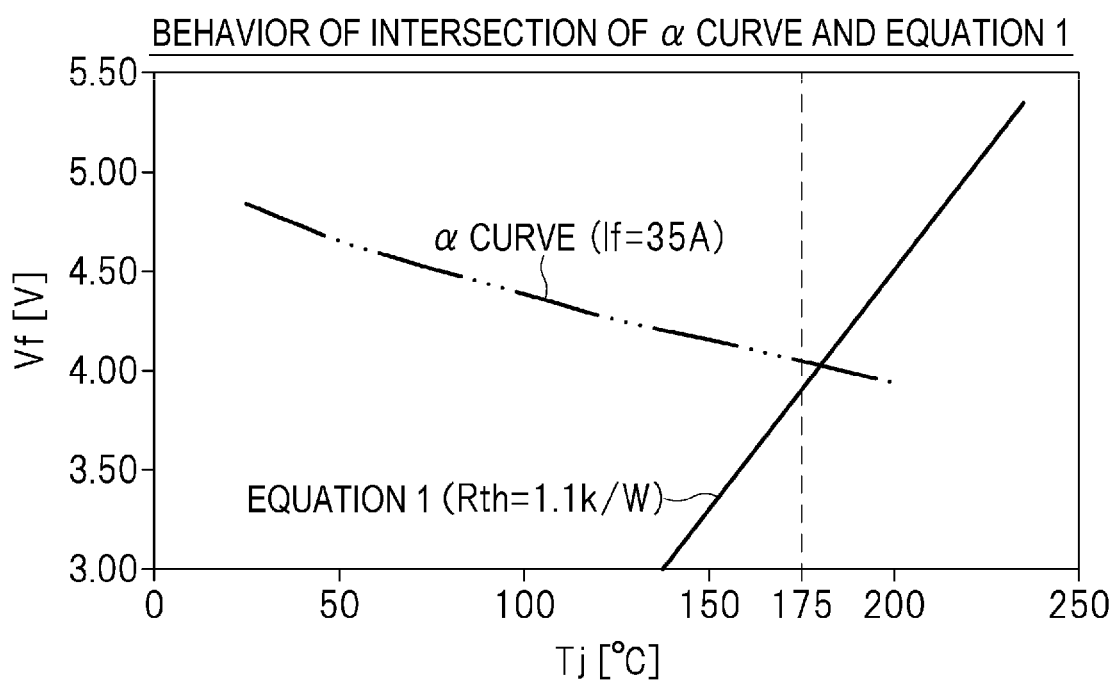
FIG. 10 is a graph illustrating a behavior of the intersection of the α curve and Equation 1.

As illustrated in FIG. 10, even in a case where the thermal resistance value Rth is 1.1 k/W, when the forward current If is set to about 35 A, the intersection of the α curve and Equation 1 approaches the optimum condition. However, in FIG. 10, since the forward current If is low, it is necessary to lengthen the energization time in order to grow the stacking fault, and the time required to screen the semiconductor device 100 increases.

In addition, the growth rate of the stacking fault is mainly determined by the concentration of holes accumulated in the semiconductor layer 2 during the energization of the built-in diode, but the concentration of the accumulated holes greatly depends on the junction temperature Tj and the forward current If. Therefore, even in FIG. 8, when the specifications of the product are changed, the maximum rated junction temperature Tjmax and the maximum rated forward current Ifmax change, and thus the condition for growing the stacking fault is changed. That is, when the thermal resistance value Rth is fixed, it is difficult to keep the accuracy of sorting of the semiconductor device 100 constant.

In addition, since it is necessary to apply a voltage of several thousands of volts in the measurement of the leakage current Idss performed in steps S102 and S109 of the study example and it cannot be performed by a normal energization inspection apparatus, it is necessary to perform steps S102 and S109 by another apparatus. Therefore, the time required to screen the semiconductor device 100 increases by the work of transferring the device and performing the measurement.

In addition, in the measurement of the leakage current Idss, since a voltage of several thousands of volts is applied, discharge is likely to occur. Therefore, the measurement of the leakage current Idss may be performed at a voltage lower than the maximum rated voltage Vdss. Then, the leakage current Idss1, the leakage current Idss2, and the value ΔIdss of change are measured to be lower than those in the case of the maximum rated voltage Vdss. Therefore, a withstand voltage failure of the semiconductor device 100 may occur after a post process or after commercialization.

As described above, in consideration of the problems in the study example, there is a demand for a method capable of reducing the time required to screen the semiconductor device 100 and making the accuracy of sorting of the semiconductor device 100 constant regardless of the product specifications. In addition, when not only the measurement of the on-voltage Von but also the measurement of the leakage current Idss can be performed by the same energization inspection apparatus, the time required to screen the semiconductor device 100 can be further reduced.

Figure 11:
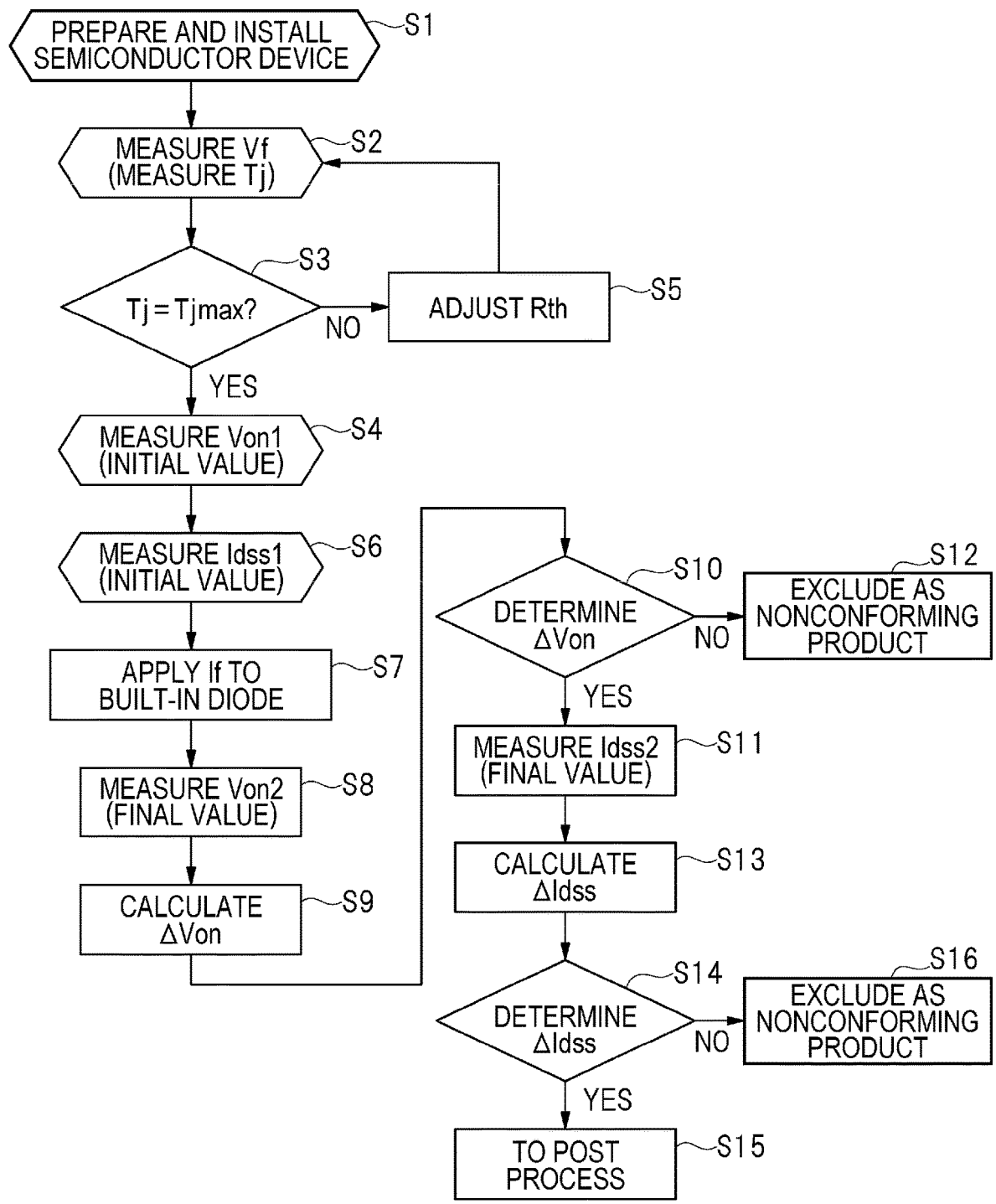
FIG. 11 is a flowchart illustrating an energization method (method for manufacturing a semiconductor device) according to the first embodiment.

Energization Method (Method for Manufacturing Semiconductor Device) According to First Embodiment The energization method according to the first embodiment will be described below with reference to FIG. 11. Note that steps S2 to S14 illustrated in FIG. 11 are performed on the semiconductor device 100 between step S1 (the manufacturing process described in FIGS. 1 to 4) and a post process of step S15, and thus, these steps can be collectively regarded as a "method for manufacturing a semiconductor device". That is, the method for manufacturing the semiconductor device according to the first embodiment includes the energization method in steps S2 to S14.

First, in step S1, the semiconductor device 100 is prepared. That is, the semiconductor device 100 manufactured by the manufacturing process described with reference to FIGS. 1 to 4 is prepared. Next, the semiconductor device 100 is transferred to the energization inspection apparatus 200, and the semiconductor device 100 is installed between the measurement electrode 24 and the measurement electrode 26 and between the measurement electrode 24 and the measurement electrode 27. Then, the measurement electrode 24 is electrically connected to the drain electrode 10, the measurement electrode 26 is electrically connected to the source electrode 8, and the measurement electrode 27 is electrically connected to the gate pad electrode 9.

In step S2, the junction temperature Tj of the semiconductor device 100 is set. The junction temperature Tj is set by applying the maximum rated forward current Ifmax as a direct current to the built-in diode. In addition, the maximum rated forward voltage Vfmax at that time is measured.

In step S3, it is determined whether or not the junction temperature Tj is the maximum rated junction temperature Tjmax. When the junction temperature Tj is the maximum rated junction temperature Tjmax (YES), the next step is step S4. When the junction temperature Tj is not the maximum rated junction temperature Tjmax (NO), the resistance value of the variable thermal resistance mechanism of the insulating plate 22 is adjusted, and the thermal resistance value Rth of the above-described "Equation 1" is adjusted in step S5. That is, the resistance value of the variable thermal resistance mechanism is adjusted such that the maximum rated junction temperature Tjmax is reached when the maximum rated forward current If max is applied to the built-in diode. Steps S2, S3, and S5 are repeated until this state is obtained.

In step S4, the on-voltage Von1 in the initial state is measured. A method for measuring the on-voltage Von1 is the same as that in step S104.

In step S6, the leakage current Idss1 in the initial state is measured. For example, in a state where the source electrode 8 and the gate pad electrode 9 are electrically short-circuited or in a state where a negative bias is applied to the gate pad electrode 9 with respect to the source electrode 8, 0 V is applied to the source electrode 8, and the leakage current Idss1 when a specified voltage is applied to the drain electrode 10 is measured. Here, the specified voltage is the maximum rated voltage Vdss. In step S6, the pressure inside the pressure vessel 28 is set to a pressure higher than the pressure outside the pressure vessel 28. Accordingly, even when the maximum rated voltage Vdss of several thousands of volts is applied, it is possible to prevent discharge from occurring inside the pressure vessel 28.

In step S7, the forward current If is applied to the built-in diode of the semiconductor device 100 to grow the stacking fault. Here, the forward current If is the maximum rated forward current If max. That is, the maximum rated forward current Ifmax is applied to the built-in diode at the maximum rated junction temperature Tjmax.

In step S8, the on-voltage Von2 in the final state is measured by the same method as in step S4.

In step S9, the value ΔVon of change in voltage between the on-voltage Von2 and the on-voltage Von1 is calculated. The value ΔVon of change is obtained from ΔVon=(Von2−Von1)/Von1. The value ΔVon of change described here is an absolute value.

In step S10, the value ΔVon of change is determined. When the value ΔVon of change is smaller than the specified value, it can be determined that there is no or almost no growth of the stacking fault, so that the semiconductor device 100 is sorted as a conforming product. For example, when the value ΔVon of change is smaller than 0.02 (YES), the semiconductor device 100 is sorted as a conforming product. Then, the next step is step S11. When the value ΔVon of change is larger than or equal to 0.02 (NO), the semiconductor device 100 is excluded as a nonconforming product as in step S12.

In step S11, the leakage current Idss2 in the final state is measured by the same method as in step S6.

In step S13, the value ΔIdss of change in current between the leakage current Idss2 and the leakage current Idss1 is calculated. The value ΔIdss of change is obtained from ΔIdss=Idss2−Idss1. The value ΔIdss of change described here is an absolute value.

In step S14, the value ΔIdss of change is determined. When the value ΔIdss of change is smaller than the specified value, it can be determined that there is no or almost no growth of the stacking fault, so that the semiconductor device 100 is sorted as a conforming product. For example, when the value ΔIdss of change is less than 1 μA (YES), the semiconductor device 100 is sorted as a conforming product. Then, the next step is step S15, and the post process or the like is performed on the semiconductor device 100. When the value ΔIdss of change is greater than or equal to 1 μA (NO), the semiconductor device 100 is excluded as a non-conforming product as in step S16.

In a normal energization inspection apparatus, a thermal resistance value Rth is fixed as in the study example. On the other hand, in the energization inspection apparatus 200 of the first embodiment, since the insulating plate 22 has the variable thermal resistance mechanism, the thermal resistance value Rth can be made variable. Therefore, the maximum rated forward current Ifmax can be applied to the built-in diode at the maximum rated junction temperature Tjmax. Therefore, the energization time for growing the stacking fault can be significantly shortened, and the time required to screen the semiconductor device 100 can be reduced.

In addition, since the thermal resistance value Rth can be made variable, even when the specifications of the product are changed and the condition for growing the stacking fault changes, the time required to sort the semiconductor device 100 can be minimized. When the maximum rated voltage Vdss of the product is low (for example, 600 V or 1200 V), the above-described ΔVon generally tends to be lower than a high withstand voltage (for example, 3.3 kV). This is because the thickness of the epi layer constituting the semiconductor layer 2 is reduced. In such a case, a criterion for determining the on-voltage may be loosened or eliminated, and only the determination of ΔIdss may be performed.

In addition, since the measurement of the leakage current Idss can be performed at the maximum rated voltage Vdss, it is possible to reduce the possibility that a withstand voltage failure of the semiconductor device 100 occurs after a post process or the like.

In addition, since not only the measurement of the on-voltage Von but also the measurement of the leakage current Idss can be performed by the same energization inspection apparatus 200, the time required to screen the semiconductor device 100 can be further reduced, and the semiconductor device 100 can be precisely screened. Thus, the semiconductor device 100 with high reliability can be provided.

Second Embodiment

An energization method (method for manufacturing a semiconductor device) according to a second embodiment will be described below with reference to FIGS. 12 and 13. In the following description, differences from the first embodiment will be mainly described, and description of points overlapping with the first embodiment will be omitted.

In the second embodiment, the semiconductor device 100 is screened using a method different from that in the first embodiment. In the second embodiment, steps S40 to S49 illustrated in FIG. 13 are performed instead of steps S2 to S14 of the first embodiment illustrated in FIG. 11. That is, the method for manufacturing the semiconductor device according to the second embodiment includes the energization method in steps S40 to S49.

Preliminary Experiment

Figure 12:
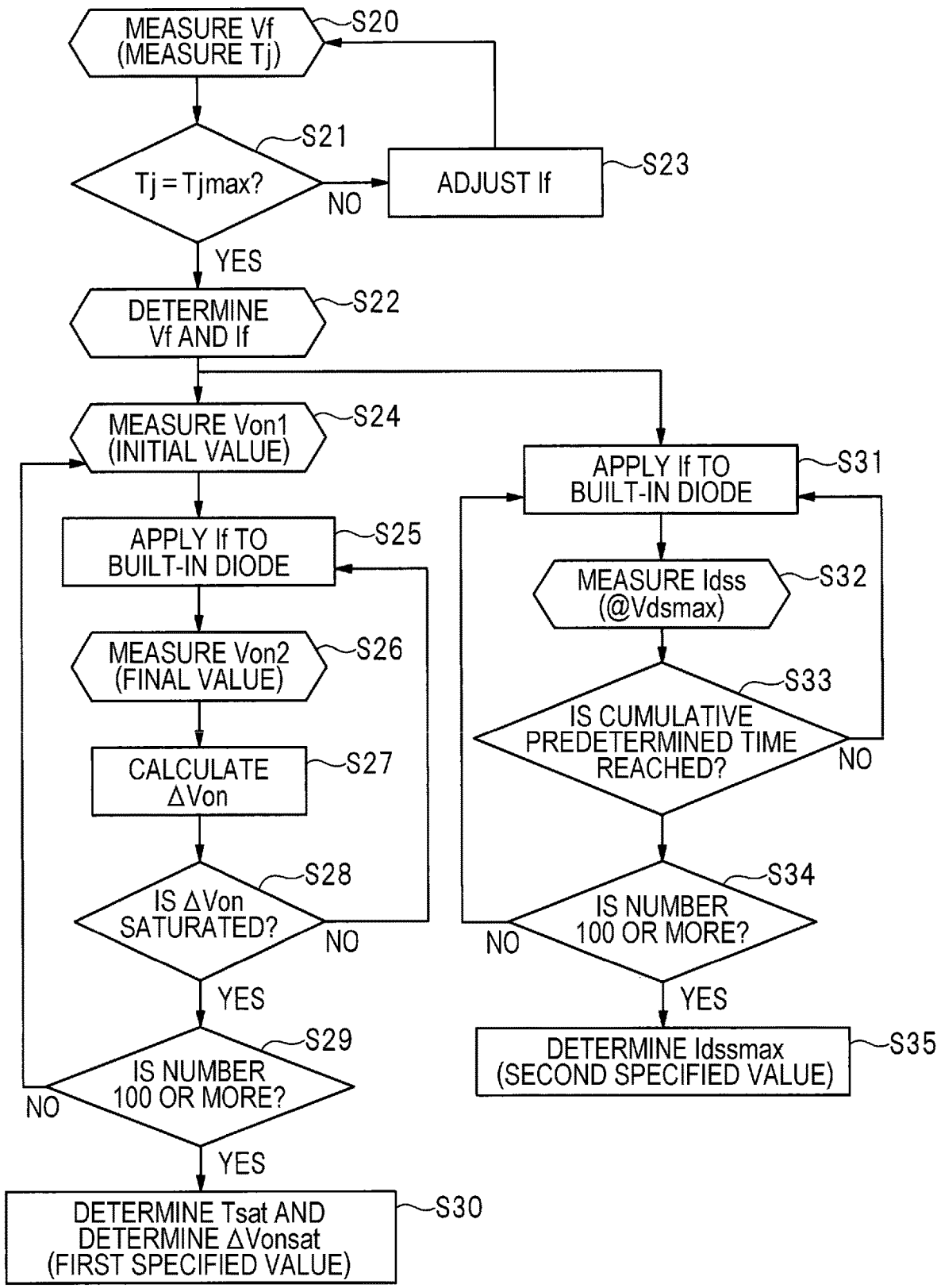
FIG. 12 is a flowchart illustrating a preliminary experiment according to a second embodiment.
Figure 13:
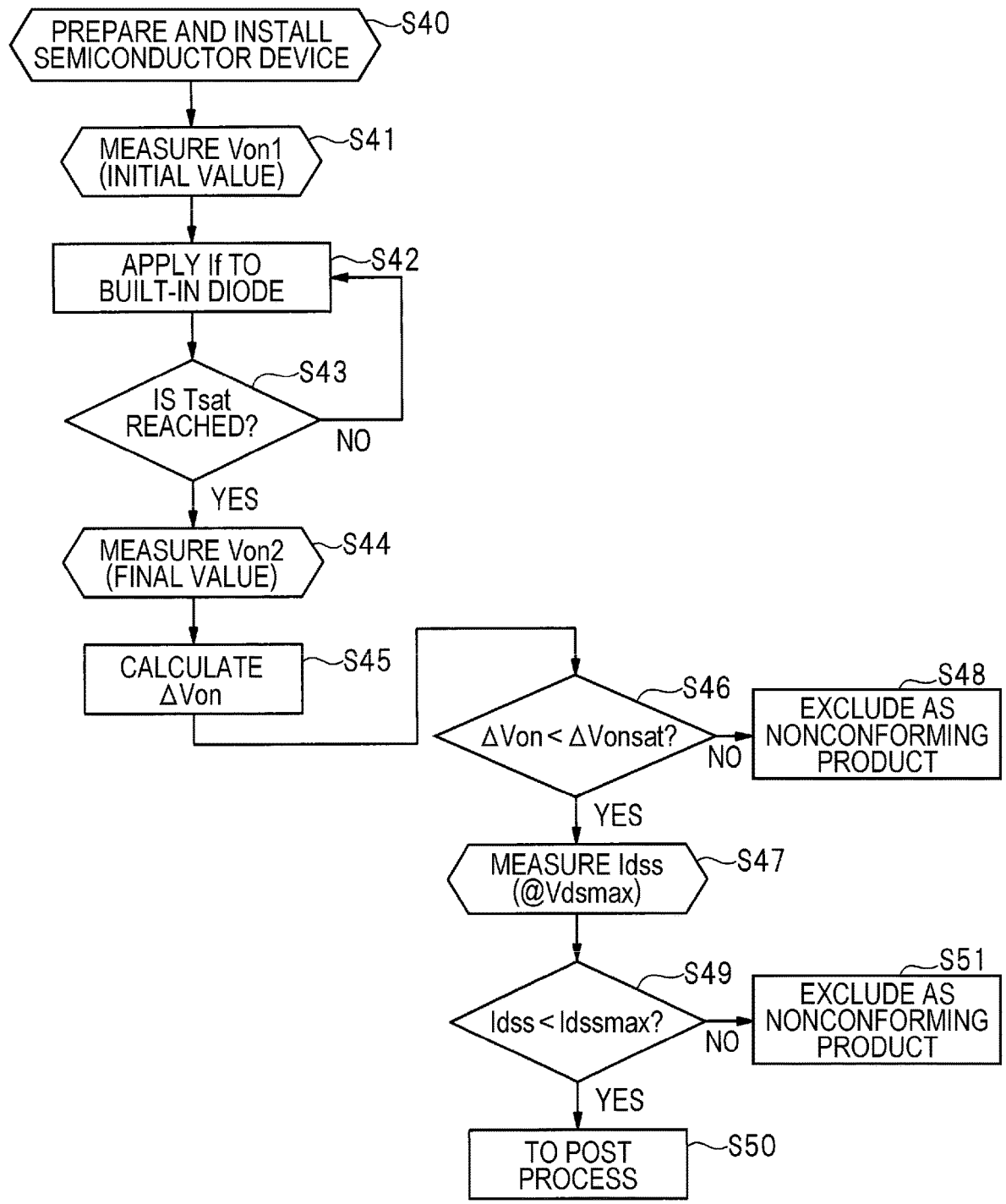
FIG. 13 is a flowchart illustrating an energization method (method for manufacturing a semiconductor device) according to the second embodiment.

Before steps S40 to S49 illustrated in FIG. 13 are performed, an experiment illustrated in FIG. 12 is performed on each of a plurality of experimental semiconductor devices 100.

In step S20, the junction temperature Tj of the semiconductor device 100 is set. The junction temperature Tj is set by applying a forward current If as a direct current to a built-in diode.

In step S21, it is determined whether or not the junction temperature Tj is the maximum rated junction temperature Tjmax. When the junction temperature Tj is the maximum rated junction temperature Tjmax (YES), the next step is step S22. When the junction temperature Tj is not the maximum rated junction temperature Tjmax (NO), the forward current If to be applied to the built-in diode is adjusted until the junction temperature Tj reaches the maximum rated junction temperature Tjmax in step S23. In and after S22, the adjusted forward current If and a forward voltage Vf are used.

In step S24, an on-voltage Von1 in the initial state is measured. A method for measuring the on-voltage Von1 is the same as that in step S4. In step S25, the forward current If is applied to the built-in diode of the semiconductor device 100 to grow a stacking fault. In step S26, an on-voltage Von2 in the final state is measured by the same method as in step S24. In step S27, the value ΔVon of change in voltage between the on-voltage Von2 and the on-voltage Von1 is calculated. The value ΔVon of change is obtained from ΔVon=(Von2−Von1)/Von1.

In step S28, it is determined whether ΔVon is saturated. When ΔVon is saturated, the next step is step S29. When ΔVon is not saturated, the process returns to step S25.

In step S29, it is determined whether or not data serving as a sample of the experiment has been sufficiently acquired. Here, when the number of experimental semiconductor devices 100 is, for example, 100 or more, it is determined that the experimental data is sufficient, and the next step is step S30. When the number is less than 100, the process returns to step S24, and the experiment is performed on the next experimental semiconductor device 100. Note that the number of experimental semiconductor devices 100 is not limited to 100, and the larger the number, the more preferable.

Figure 14:
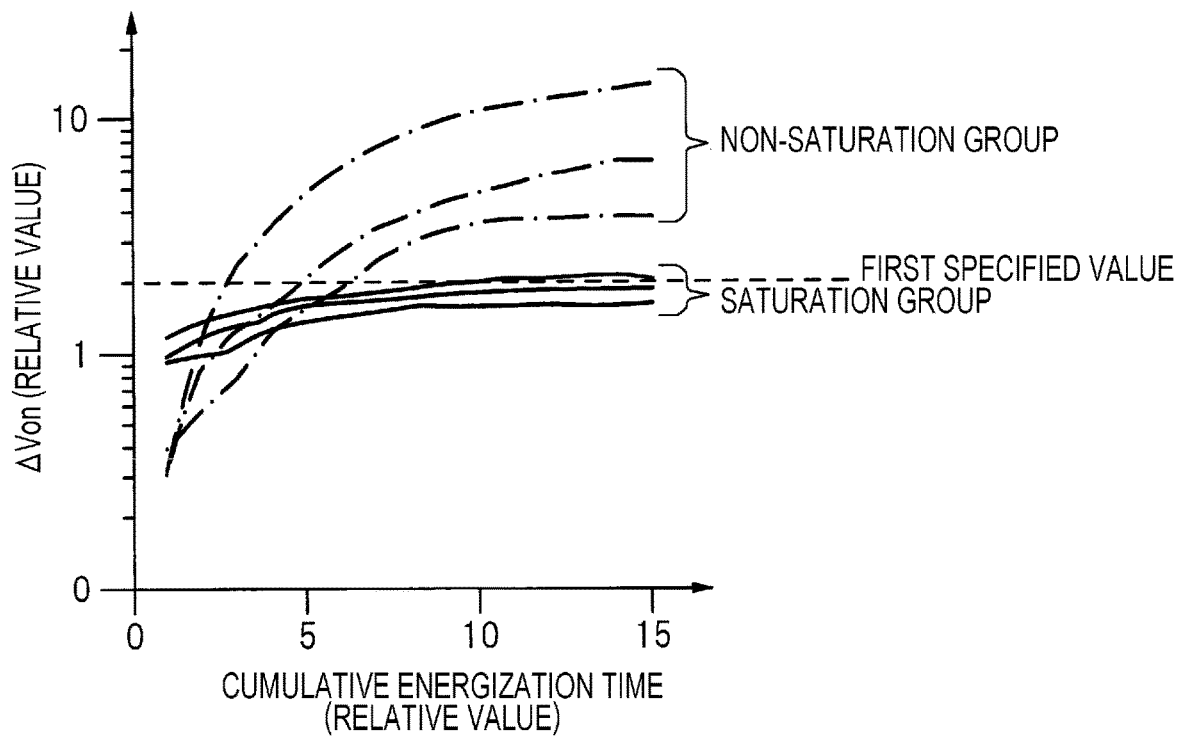
FIG. 14 is a graph illustrating a relationship between a value ΔVon of change and a cumulative energization time.

In step S30, a saturation time Tsat and a saturated value ΔVonsat of change in the on-voltage are determined. FIG. 14 is a graph illustrating a relationship between the value ΔVon of change obtained by this experiment and a cumulative energization time.

Most of the plurality of experimental semiconductor devices 100 are represented by graphs illustrated in a "saturation group". In the "saturation group", the value ΔVon of change hardly fluctuates with the elapse of the energization time, and the value ΔVon of change is saturated. That is, in the "saturation group", a stacking fault hardly increases with the elapse of the energization time, and a resistance component does not increase. Therefore, the semiconductor devices 100 of the "saturation group" can be determined to be conforming products.

On the other hand, some of the plurality of experimental semiconductor devices 100 may include devices to be represented by graphs illustrated in a "non-saturation group". In the "non-saturation group", the value ΔVon of change fluctuates as the energization time elapses. That is, in the "non-saturation group", a stacking fault increases and a resistance component increases as the energization time elapses, so that the on-voltage fluctuates. Therefore, the semiconductor devices 100 of the "non-saturation group" can be determined to be nonconforming products.

From the graph of FIG. 14, the energization time during which the value ΔVon of change of a semiconductor device 100 of the "saturation group" can be regarded as being sufficiently saturated can be determined as the saturation time Tsat. In addition, a first specified value illustrated in FIG. 14 is a value (saturated value ΔVonsat of change in the on-voltage) when the value ΔVon of change in voltage between the on-voltage Von2 and the on-voltage Von1 of the semiconductor device 100 of the "saturation group" is saturated during the saturation time Tsat in this experiment.

For example, the first specified value in FIG. 14 is set as the saturated value ΔVonsat of change in the on-voltage of the semiconductor device 100 of the "saturation group" in a case where the saturation time Tsat is the energization time "10". To ensure the reliability of the screening of the semiconductor device 100, the longer the energization time, the more reliably the "non-saturation group" can be excluded.

Figure 15:
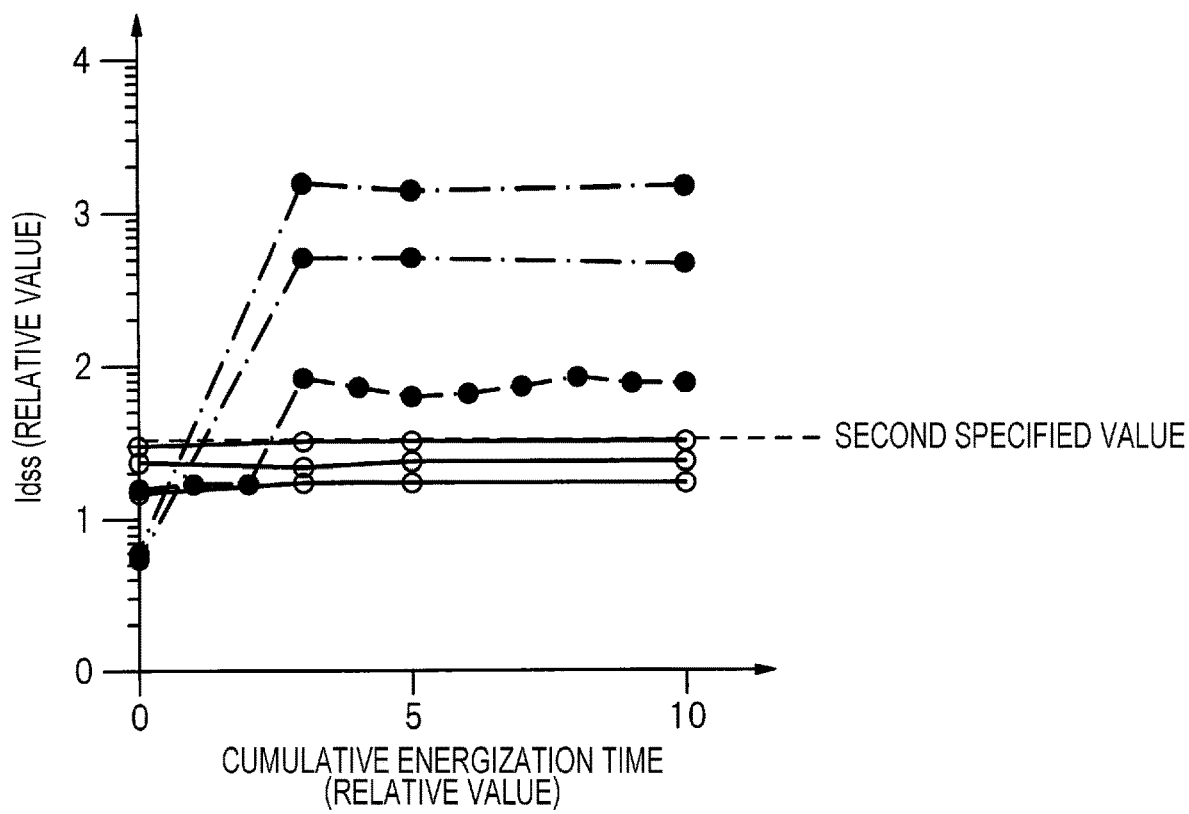
FIG. 15 is a graph illustrating a relationship between a leakage current Idss and a cumulative energization time.

On the other hand, in order to shorten the screening time and improve the productivity of the semiconductor device 100, it is preferable that the energization time be short, such as an energization time "5". In this case, the semiconductor devices 100 of the "non-saturation group" may also be included. However, as illustrated in FIG. 15 to be described later, as long as it has been experimentally confirmed that the leakage current Idss rapidly changes before the energization time "5" even when the energization time is short to some extent, it is possible to exclude the semiconductor devices 100 of the "non-saturation group" with the value ΔVon of change as a nonconforming product by sorting the semiconductor device 100 with the energization time "5" based on the leakage current Idss.

In consideration of these circumstances, the saturation time Tsat is preferably set to a time in which the first specified value that causes the "non-saturation group" to be excluded in FIG. 14 can be set. However, in order to shorten the energization time, the saturation time Tsat may be set to a time in which there is a possibility that a part of the "non-saturation group" is included in FIG. 14, and may be set to a time longer than a time in which the leakage current Idss rapidly changes in FIG. 15.

Furthermore, in the experiment illustrated in FIG. 12, the leakage current Idss is also measured for a plurality of experimental semiconductor devices 100. In this measurement, an experimental semiconductor device 100 different from the experimental semiconductor device 100 used in steps S24 to S30 is used. Steps S31 to S35 regarding the measurement of the leakage current Idss will be described.

In step S31, the forward current If is applied to the built-in diode of the semiconductor device 100 to grow a stacking fault.

In step S32, the leakage current Idss is measured. For example, in a state where the source electrode 8 and the gate pad electrode 9 are electrically short-circuited or in a state where a negative bias is applied to the gate pad electrode 9 with respect to the source electrode 8, 0 V is applied to the source electrode 8, and the leakage current Idss when a predetermined voltage is applied to the drain electrode 10 is measured. Here, the predetermined voltage is the maximum rated voltage Vdss.

In step S33, it is determined whether or not the energization time of the built-in diode has reached a cumulative predetermined time. That is, when the energization time of the built-in diode has reached the cumulative predetermined time (saturation time Tsat or time set longer than saturation time Tsat), the next step is step S34. When the energization time of the built-in diode has not reached the cumulative predetermined time, the process returns to step S31.

In step S34, it is determined whether or not data serving as a sample of the experiment has been sufficiently acquired. Here, as in step S29, the number of experimental semiconductor devices 100 is 100 or more, but the larger the number, the more preferable.

In step S35, the maximum leakage current Idssmax is determined. FIG. 15 is a graph illustrating a relationship between the leakage current Idss obtained by this experiment and a cumulative energization time.

An increase in the leakage current Idss tends to be saturated as the energization time elapses, but the leakage current Idss may suddenly increase in some of the plurality of experimental semiconductor devices 100. Studies by the inventors of the present application have revealed that such a sudden increase in the leakage current Idss may occur not only in the "non-saturation group" but also in the "saturation group" in FIG. 14.

The stacking fault grows along a basal plane, and at that time, when a specific dislocation crossing a PN junction formed in the semiconductor substrate occurs, it is presumed that the leakage current Idss tends to increase. Then, it is presumed that this is the cause of the above-described sudden increase in the leakage current Idss.

Therefore, in the second embodiment, not only the screening determination is performed based on the first specified value, but also the screening determination is performed by setting a second specified value for the semiconductor device 100 in which the leakage current Idss occurs to some extent.

The second specified value is set with reference to the leakage current Idss measured in step S33. For example, the second specified value is set to the value of the largest leakage current Idss or a value slightly larger than the leakage current Idss after a semiconductor device in which a sudden increase in the leakage current Idss occurs is excluded. The second specified value set in this manner is set as the maximum leakage current Idssmax. In addition, in this case, it is confirmed whether it is possible to exclude a semiconductor device in which a sudden increase in the leakage current Idss occurs in the energization time of the saturation time Tsat. Therefore, the cumulative predetermined time in step S33 is set to a time equal to or longer than the saturation time Tsat.

As described above, the experiment illustrated in FIG. 12 is performed in advance on the plurality of experimental semiconductor devices 100, and based on this result, the saturation time Tsat, the first specified value (the saturated value ΔVonsat of change in the on-voltage), and the second specified value (the maximum leakage current Idssmax) are determined.

Energization Method (Method for Manufacturing Semiconductor Device) According to Second Embodiment An energization method (method for manufacturing a semiconductor device) according to the second embodiment will be described below with reference to FIG. 13. The energization method (method for manufacturing a semiconductor device) according to the second embodiment can be performed without using the energization inspection apparatus 200, but may be performed using the energization inspection apparatus 200 as in the first embodiment.

First, in step S40, the semiconductor device 100 is prepared. That is, similarly to the first embodiment, the semiconductor device 100 manufactured by the manufacturing process described with reference to FIGS. 1 to 4 is prepared.

In step S41, the on-voltage Von1 in the initial state is measured. A method for measuring the on-voltage Von1 is the same as that in step S24. In step S42, the forward current If is applied to the built-in diode of the semiconductor device 100 in the saturation time Tsat to grow a stacking fault.

In step S43, it is confirmed whether the energization time of the built-in diode has reached the saturation time Tsat. When the energization time has reached the saturation time Tsat (YES), the next step is step S44. When the energization time has not reached the saturation time Tsat (NO), step S42 is repeated until the energization time reaches the saturation time Tsat. In step S44, the on-voltage Von2 in the final state is measured by the same method as in step S41.

In step S45, the value ΔVon of change in voltage between the on-voltage Von2 and the on-voltage Von1 is calculated. The value ΔVon of change is obtained from ΔVon=(Von2−Von1)/Von1.

In step S46, the value ΔVon of change is determined. When the value ΔVon of change is smaller than the first specified value (saturated value ΔVonsat of change in the on-voltage) (YES), semiconductor device 100 is sorted as a conforming product. Then, the next step is step S47. When the value ΔVon of change is larger than the first specified value (NO), the semiconductor device 100 is excluded as a nonconforming product as in step S48.

In step S47, the leakage current Idss is measured by the same method as in step S31. The leakage current Idss is measured based on the maximum rated voltage of the semiconductor device 100.

In step S49, the leakage current Idss is determined. When the leakage current Idss is smaller than the second specified value (maximum leakage current Idssmax) (YES), the semiconductor device 100 is sorted as a conforming product. Then, the next step is step S50, and a post process or the like is performed on the semiconductor device 100. When the leakage current Idss is larger than the second specified value (NO), the semiconductor device 100 is excluded as a nonconforming product as in step S51.

As described above, in the second embodiment, by setting the energization time of the built-in diode to the saturation time Tsat and using the first specified value (saturated value ΔVonsat of change in the on-voltage) and the second specified value (maximum leakage current Idssmax), the semiconductor device 100 can be precisely screened. Therefore, since the semiconductor device 100 in which the value ΔVon of change in the on-voltage is small and the leakage current Idss is small can be sorted, the semiconductor device 100 with high reliability can be provided.

Third Embodiment

An energization method (method for manufacturing a semiconductor device) according to a third embodiment will be described below with reference to FIGS. 16 and 17. In the following description, differences from the second embodiment will be mainly described, and description of points overlapping with the second embodiment will be omitted.

In the second embodiment, the leakage current Idss is sorted by comparison with the second specified value (maximum leakage current Idssmax). In the third embodiment, the value ΔIdss of change is used to sort a leakage current Idss as in the first embodiment. Therefore, in the third embodiment, some of steps S40 to S49 of the second embodiment illustrated in FIG. 13 are replaced with steps S70 to S73 illustrated in FIG. 17.

Preliminary Experiment

Figure 16:
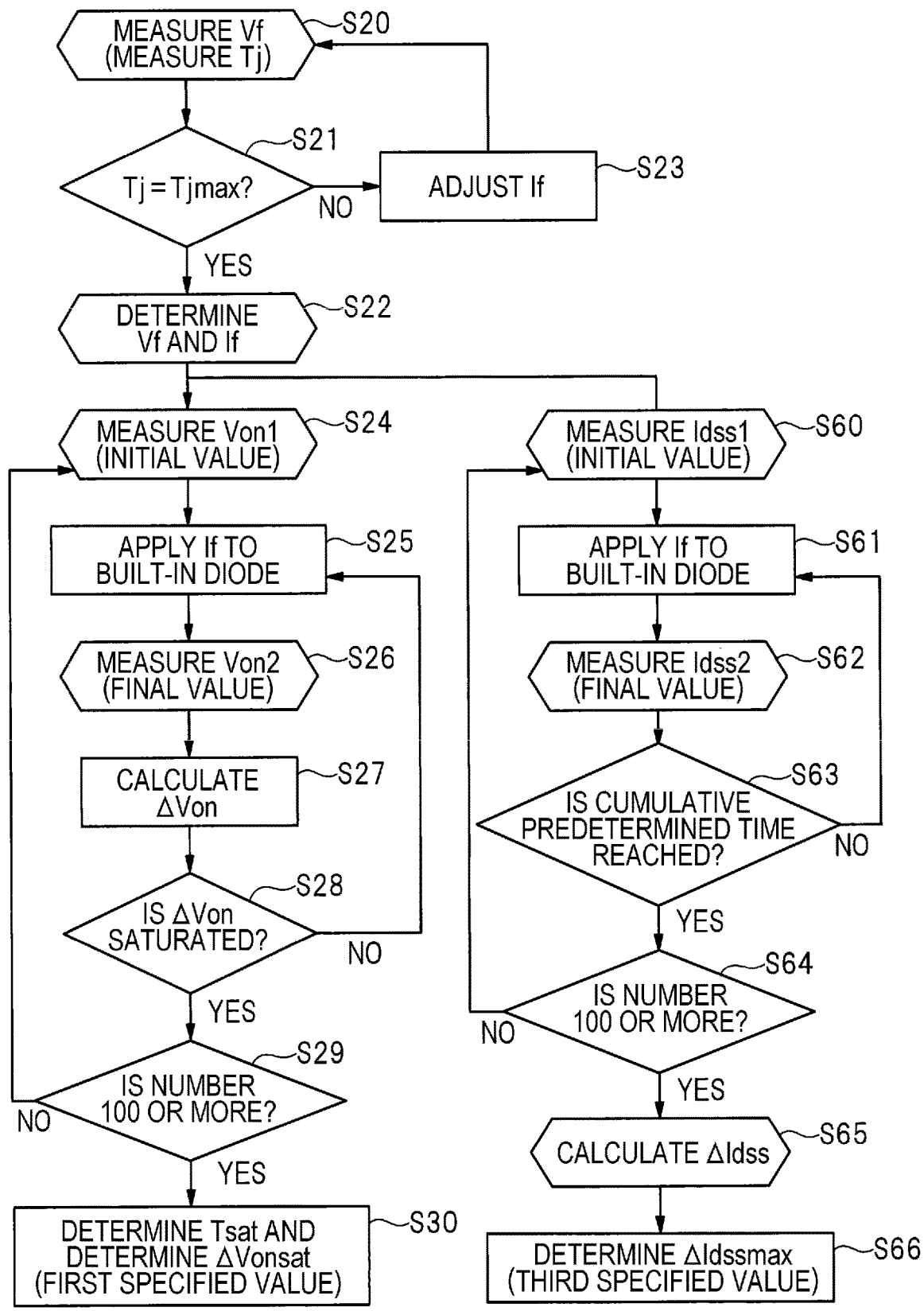
FIG. 16 is a flowchart illustrating a preliminary experiment according to a third embodiment.
Figure 17:
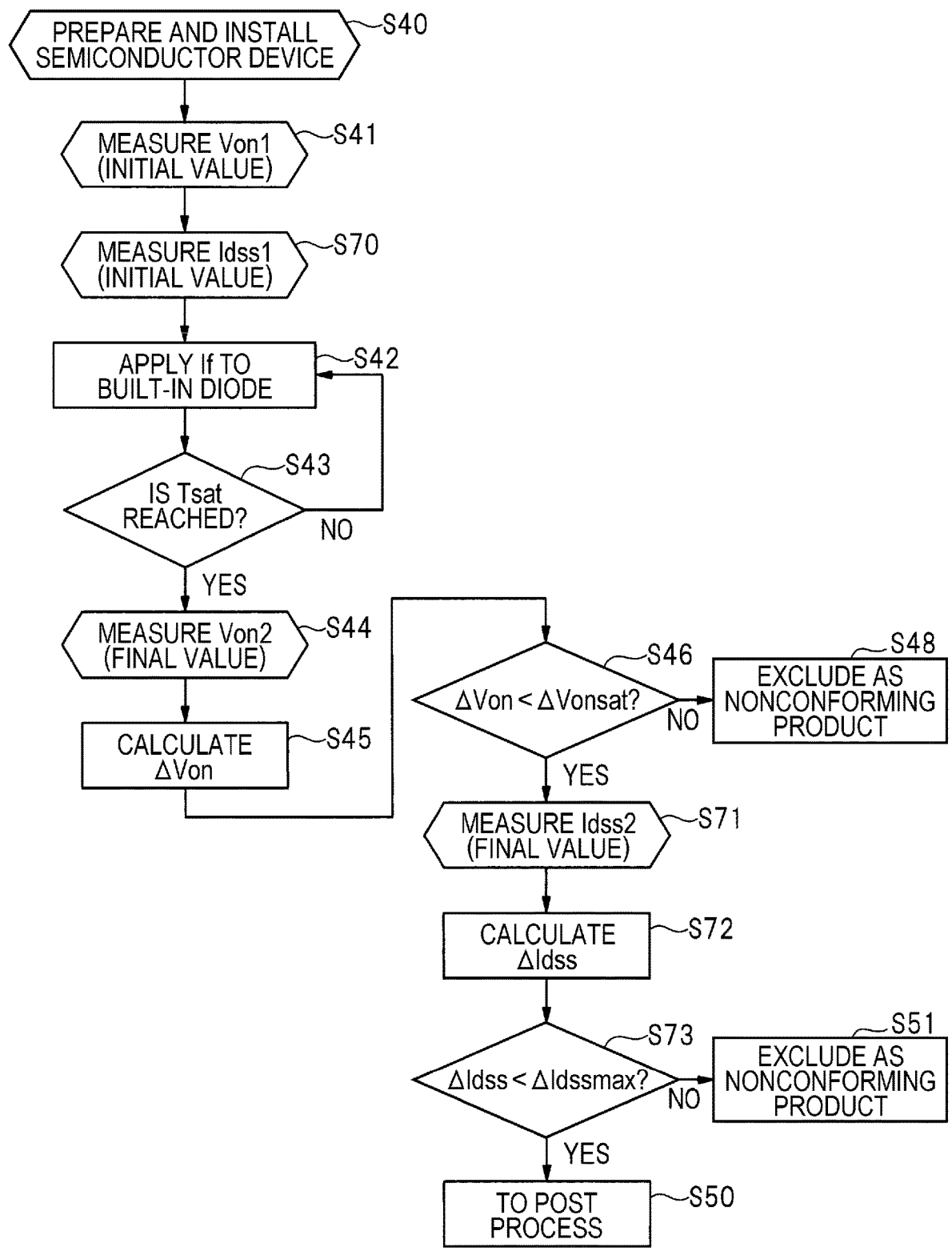
FIG. 17 is a flowchart illustrating an energization method (method for manufacturing a semiconductor device) according to the third embodiment.

Before steps S40 to S48 and S70 to S73 illustrated in FIG. 17 are performed, an experiment illustrated in FIG. 16 is performed on a plurality of experimental semiconductor devices 100. Since an experiment regarding the first specified value (saturated value ΔVonsat of change in the on-voltage) is the same as steps S20 to S30 of the second embodiment, the description thereof will be omitted.

First, after step S22, step S60 is performed. In step S60, a leakage current Idss1 is measured using the same method as in step S32. The leakage current Idss1 is measured based on the maximum rated voltage of the semiconductor device 100. In step S61, a forward current If is applied to the built-in diode of the semiconductor device 100 to grow a stacking fault. In step S62, a leakage current Idss2 is measured using the same method as in step S60. The leakage current Idss2 is measured based on the maximum rated voltage of the semiconductor device 100.

In step S63, it is determined whether or not the energization time of the built-in diode has reached a cumulative predetermined time. That is, when the energization time of the built-in diode has reached the cumulative predetermined time (saturation time Tsat or time set longer than saturation time Tsat), the next step is step S64. When the energization time of the built-in diode has not reached the cumulative predetermined time, the process returns to step S61.

In step S64, it is determined whether or not data serving as a sample of the experiment has been sufficiently acquired. Here, as in step S29, the number of experimental semiconductor devices 100 is 100 or more, but the larger the number, the more preferable.

In step S65, the value ΔIdss of change in the leakage current is calculated. The value ΔIdss of change is obtained from ΔIdss=Idss2−Idss1.

In step S66, the maximum value ΔIdssmax of change in the leakage current is determined as a third specified value. The third specified value is set with reference to the value ΔIdss of change calculated in step S64. For example, the third specified value is set to the largest value ΔIdss of change or a value slightly larger than the largest value ΔIdss of change among values ΔIdss of change calculated in the plurality of experimental semiconductor devices 100 after a semiconductor device in which a sudden increase in the leakage current Idss illustrated in FIG. 15 occurs is excluded. The third specified value set in this manner is set as the maximum value ΔIdssmax of change in the leakage current. The maximum value ΔIdssmax of change is, for example, 1 μA.

As described above, the experiment illustrated in FIG. 16 is performed in advance on the plurality of experimental semiconductor devices 100, and based on this result, the saturation time Tsat, the first specified value (saturated value ΔVonsat of change in the on-voltage), and the third specified value (maximum value ΔIdssmax of change in the leakage current) are determined.

Energization Method (Method for Manufacturing Semiconductor Device) According to Third Embodiment An energization method (method for manufacturing a semiconductor device) according to the third embodiment will be described below with reference to FIG. 17. The energization method (method for manufacturing a semiconductor device) according to the third embodiment can be performed without using the energization inspection apparatus 200, but may be performed using the energization inspection apparatus 200 as in the first embodiment.

In the third embodiment, step S70 is performed between step S41 and step S42. Note that step S70 may be between step S40 and step S41. In step S70, the leakage current Idss1 is measured using the same method as in step S60. Thereafter, steps S42 to S48 are performed similarly to the second embodiment. Steps S71 to S73 are performed on the semiconductor device 100 sorted as a conforming product in step S46.

In step S71, the leakage current Idss2 is measured using the same method as in step S62. The leakage current Idss2 is measured based on the maximum rated voltage of the semiconductor device 100. In step S72, the value ΔIdss of change in the leakage current is calculated. The value ΔIdss of change is obtained from ΔIdss=Idss2−Idss1.

In step S73, the value ΔIdss of change is determined. When the value ΔIdss of change is smaller than the third specified value (the maximum value ΔIdssmax of change in the leakage current) (YES), the semiconductor device 100 is sorted as a conforming product. Then, the next step is step S50, and a post process or the like is performed on the semiconductor device 100. When the value ΔIdss of change is larger than the third specified value (NO), the semiconductor device 100 is excluded as a nonconforming product as in step S51.

As described above, in the third embodiment, the energization time of the built-in diode is set to the saturation time Tsat, and the first specified value (saturated value ΔVonsat of change in the on-voltage) and the third specified value (maximum value ΔIdssmax of change in the leakage current) are used, whereby the semiconductor device 100 can be precisely screened. Therefore, since the semiconductor device 100 in which the value ΔVon of change in the on-voltage is small and the leakage current Idss is small can be sorted, the semiconductor device 100 with high reliability can be provided.

Although the present invention has been specifically described based on the above embodiments, the present invention is not limited to the above embodiments, and various modifications can be made without departing from the gist of the present invention.

REFERENCE SIGNS LIST 1 semiconductor substrate
2 semiconductor layer
3 body region
4 source region
5 gate insulator film
6 gate electrode
7 interlayer insulator film
8 source electrode (source pad electrode)
9 gate pad electrode
10 drain electrode
21 cooling plate
22 insulating plate
23 control device
24 measurement electrode
25 conductive sheet
26 measurement electrode
27 measurement electrode
28 pressure vessel
100 semiconductor device (semiconductor chip)
200 energization inspection apparatus

The invention claimed is:
1. An energization method using an energization inspection apparatus including:
a cooling plate;
an insulating plate provided on the cooling plate and having a variable thermal resistance mechanism;
a first electrode provided on the insulating plate; and
a second electrode and a third electrode provided above the first electrode and located away from the first electrode, the energization method comprising:
(a) preparing a semiconductor device including a drain electrode, a source electrode, and a gate pad electrode;
(b) after step (a), installing the semiconductor device between the first electrode and the second electrode and between the first electrode and the third electrode, electrically connecting the first electrode to the drain electrode, electrically connecting the second electrode to the source electrode, and electrically connecting the third electrode to the gate pad electrode;
(c) after step (b), adjusting a resistance value of the variable thermal resistance mechanism such that a maximum rated junction temperature of the semiconductor device is reached when a maximum rated forward current of the semiconductor device is applied to a built-in diode of the semiconductor device;
(d) after step (c), measuring a first on-voltage of the semiconductor device;
(e) after step (c), measuring a first leakage current when a specified voltage is applied between the source electrode and the drain electrode in a state where the source electrode and the gate pad electrode are electrically short-circuited or in a state where a negative bias is applied to the gate pad electrode with respect to the source electrode;
(f) after steps (d) and (e), applying a forward current to the built-in diode;
(g) after step (f), measuring a second on-voltage of the semiconductor device;
(h) after step (g), calculating a value of change in voltage between the second on-voltage and the first on-voltage, and sorting the semiconductor device as a conforming product when the value of change in voltage is smaller than a specified value;
(i) after step (h), measuring a second leakage current when a specified voltage is applied between the source electrode and the drain electrode in a state where the source electrode and the gate pad electrode are electrically short-circuited or in a state where a negative bias is applied to the gate pad electrode with respect to the source electrode for the semiconductor device sorted as a conforming product; and
(j) after step (i), calculating a value of change in current between the second leakage current and the first leakage current, and sorting the semiconductor device as a conforming product when the value of change in current is smaller than a specified value, wherein
the semiconductor device includes:
a semiconductor substrate of a first conductivity type that has a front surface and a back surface opposite to the front surface and is made of silicon carbide;
a semiconductor layer of the first conductivity type formed on the front surface of the semiconductor substrate and made of silicon carbide;

a body region of a second conductivity type opposite to the first conductivity type formed in the semiconductor layer;

a source region of the first conductivity type formed in the body region;

a gate insulator film formed on the body region;

a gate electrode formed on the gate insulator film;

the source electrode formed on the body region and the source region so as to be electrically connected to the body region and the source region;

the gate pad electrode formed on the gate electrode so as to be electrically connected to the gate electrode; and the drain electrode formed on the back surface of the semiconductor substrate, and the built-in diode includes the body region and the semiconductor layer.

2. The energization method according to claim 1, wherein in step (f), the maximum rated forward current of the semiconductor device is applied to the built-in diode of the semiconductor device at the maximum rated junction temperature of the semiconductor device.

3. The energization method according to claim 2, wherein in steps (e) and (i), the first leakage current and the second leakage current are measured based on a maximum rated voltage of the semiconductor device.

4. The energization method according to claim 3, wherein
the energization inspection apparatus further includes a pressure vessel provided on the first electrode and capable of changing a pressure inside the pressure vessel to a pressure different from a pressure outside the pressure vessel, the second electrode and the third electrode are attached to the pressure vessel, in step (b), the semiconductor device is housed inside the pressure vessel, and in steps (e) and (i), the pressure inside the pressure vessel is higher than the pressure outside the pressure vessel.

5. The energization method according to claim 4, wherein the pressure vessel is made of an insulator.

* * * * *